(12) United States Patent
Gomi et al.

(10) Patent No.: US 9,734,981 B2
(45) Date of Patent: Aug. 15, 2017

(54) CHARGED PARTICLE BEAM WRITING APPARATUS AND CHARGED PARTICLE BEAM WRITING METHOD

(71) Applicant: NuFlare Technology, Inc., Yokohama-shi (JP)

(72) Inventors: Saori Gomi, Zushi (JP); Hitoshi Higurashi, Yokohama (JP)

(73) Assignee: NuFlare Technology, Inc., Yokohama-shi (JP)

( * ) Notice: Subject to any disclaimer, the term of this patent is extended or adjusted under 35 U.S.C. 154(b) by 0 days.

(21) Appl. No.: 15/088,487

(22) Filed: Apr. 1, 2016

(65) Prior Publication Data

US 2016/0300687 A1    Oct. 13, 2016

(30) Foreign Application Priority Data

Apr. 10, 2015   (JP) ................................ 2015-080824

(51) Int. Cl.

| | |
|---|---|
| *H01J 37/30* | (2006.01) |
| *H01J 3/26* | (2006.01) |
| *G21K 1/08* | (2006.01) |
| *G06F 9/455* | (2006.01) |
| *H01J 37/147* | (2006.01) |

(Continued)

(52) U.S. Cl.
CPC .......... *H01J 37/1472* (2013.01); *H01J 37/20* (2013.01); *H01J 37/3023* (2013.01); *H01J 37/3174* (2013.01); *H01J 2237/1504* (2013.01); *H01J 2237/202* (2013.01); *H01J 2237/3175* (2013.01)

(58) Field of Classification Search
USPC ............. 250/397, 398, 400, 396 R, 396 ML, 250/491.1, 492.1, 492.2, 492.21, 492.22, 250/492.23, 492.3, 526; 716/50, 51, 716/53–55, 100, 105, 108, 113, 118, 119, 716/123–125, 131, 134
See application file for complete search history.

(56) References Cited

U.S. PATENT DOCUMENTS 5,251,140 A * 10/1993 Chung ................... B82Y 10/00
                                                       250/492.2
6,047,116 A *  4/2000 Murakami .......... H01J 37/3026
                                                       716/54

(Continued)

FOREIGN PATENT DOCUMENTS

JP            2009-88213           4/2009

*Primary Examiner* — Bernard Souw
(74) *Attorney, Agent, or Firm* — Oblon, McClelland, Maier & Neustadt, L.L.P.

(57) ABSTRACT

A charged particle beam writing apparatus includes a circuitry to set, when a charged particle beam is deflected to move between plural small regions by a deflector, plural first mesh regions obtained by virtually dividing a chip region into regions by length and width sizes same as those of each of the plural small regions; determine whether a shot figure having been assigned exists in each of the plural first mesh regions; a circuitry to perform, for the plural first mesh regions, merging of two or more adjacent first mesh regions; a circuitry to measure, for each of plural second mesh regions each obtained by merging, the number of first mesh regions each having been determined that an assigned shot figure exists therein; and a circuitry to generate a map for each chip, where measured number of first mesh regions with the shot figure is defined as a map value.

10 Claims, 10 Drawing Sheets

(51) Int. Cl.
  *H01J 37/302* (2006.01)
  *H01J 37/317* (2006.01)
  *H01J 37/20* (2006.01)

(56) References Cited

U.S. PATENT DOCUMENTS

| | | | | |
|---|---|---|---|---|
| 6,248,508 B1* | 6/2001 | Murooka | ............... | B82Y 10/00 430/312 |
| 6,313,476 B1* | 11/2001 | Shimizu | ............... | B82Y 10/00 250/492.22 |
| 6,319,642 B1* | 11/2001 | Hara | ............... | G03F 7/704 430/296 |
| 6,566,662 B1* | 5/2003 | Murakami | ............... | B82Y 10/00 250/398 |
| 7,504,645 B2* | 3/2009 | Anpo | ............... | H01J 37/3026 250/396 R |
| 7,592,611 B2* | 9/2009 | Kasahara | ............... | B82Y 10/00 250/492.1 |
| 7,698,682 B2* | 4/2010 | Anpo | ............... | B82Y 10/00 716/55 |
| 7,750,324 B2* | 7/2010 | Oogi | ............... | B82Y 10/00 250/492.21 |
| 7,786,453 B2* | 8/2010 | Sakamoto | ............... | B82Y 10/00 250/492.2 |
| 7,949,966 B2* | 5/2011 | Anpo | ............... | B82Y 10/00 716/50 |
| 8,188,449 B2* | 5/2012 | Shibata | ............... | B82Y 10/00 250/492.2 |
| 8,207,514 B2* | 6/2012 | Hara | ............... | B82Y 10/00 250/492.1 |
| 8,280,632 B2* | 10/2012 | Sakamoto | ............... | B82Y 10/00 250/492.3 |
| 8,563,952 B2* | 10/2013 | Yashima | ............... | H01J 37/3174 250/398 |
| 8,669,537 B2* | 3/2014 | Yashima | ............... | B82Y 10/00 250/396 R |
| 8,779,379 B2* | 7/2014 | Nishimura | ............... | H01J 37/3174 250/398 |
| 9,484,185 B2* | 11/2016 | Suganuma | ............... | H01J 37/3174 |
| 2012/0286174 A1* | 11/2012 | Gomi | ............... | H01J 37/3026 250/492.3 |
| 2013/0264499 A1* | 10/2013 | Nishimura | ............... | H01J 37/30 250/492.22 |
| 2016/0155609 A1* | 6/2016 | Hara | ............... | H01J 37/3026 250/492.22 |

* cited by examiner

CHARGED PARTICLE BEAM WRITING APPARATUS AND CHARGED PARTICLE BEAM WRITING METHOD

CROSS-REFERENCE TO RELATED APPLICATION

This application is based upon and claims the benefit of priority from the prior Japanese Patent Application No. 2015-080824 filed on Apr. 10, 2015 in Japan, the entire contents of which are incorporated herein by reference.

BACKGROUND OF THE INVENTION

Field of the Invention

Embodiments of the present invention relate generally to a charged particle beam writing apparatus and a charged particle beam writing method, and more specifically, relate to a writing apparatus and method that estimate a deflection time, being a part of writing time, for performing beam deflection between subfields (SFs), for example.

Description of Related Art

In recent years, with high integration of LSI, the line width (critical dimension) of circuits of semiconductor devices is becoming progressively narrower. As a method for forming an exposure mask (also called a reticle) used to form circuit patterns on these semiconductor devices, the electron beam (EB) writing technique having excellent resolution is employed.

FIG. 14 is a conceptual diagram explaining operations of a variable-shaped electron beam writing or "drawing" apparatus. The variable-shaped electron beam writing apparatus operates as described below. A first aperture plate 410 has a quadrangular aperture 411 for shaping an electron beam 330. A second aperture plate 420 has a variable shape aperture 421 for shaping the electron beam 330 having passed through the aperture 411 of the first aperture plate 410 into a desired quadrangular shape. The electron beam 330 emitted from a charged particle source 430 and having passed through the aperture 411 is deflected by a deflector to pass through a part of the variable shape aperture 421 of the second aperture plate 420, and thereby to irradiate a target object or "sample" 340 placed on a stage which continuously moves in one predetermined direction (e.g., x direction) during writing. In other words, a quadrangular shape that can pass through both the aperture 411 of the first aperture plate 410 and the variable shape aperture 421 of the second aperture plate 420 is used for pattern writing in a writing region of the target object 340 on the stage continuously moving in the x direction. This method of forming a given shape by letting beams pass through both the aperture 411 of the first aperture plate 410 and the variable shape aperture 421 of the second aperture plate 420 is referred to as a variable shaped beam (VSB) system.

In the writing apparatus, when writing a chip pattern, the time for writing the chip pattern is estimated and the estimated time is provided to the user (e.g., refer to Japanese Patent Application Laid-open (JP-A) No. 2009-088213). Further, in the writing apparatus, a multi-stage deflection system is employed to write a pattern at a desired position. According to the multi-state deflection system, the writing region of a target object is divided into a plurality of small regions called subfields (SFs), a beam position is deflected to an SF by one deflector of multiple stage deflector, and the beam position is deflected to a pattern forming position in the SF concerned by another deflector, thereby writing a pattern at a desired position. Therefore, in addition to the time for a pattern to be written in each SF, the time for the beam to travel (move) between SFs should be considered in the writing time. Conventionally, the traveling time of the beam is calculated based on a value obtained by multiplying a divided value, which is calculated by dividing an x-direction chip size by the SF size, by a divided value, which is calculated by dividing a y-direction chip size by the SF size. That is, the traveling time of the beam is calculated on the assumption that the beam moves between all the SFs in a chip. However, patterns are not necessarily arranged in all the SFs that correspond to the chip region. In a VSB system, it is possible to skip an SF where no pattern exists and move to another SF. Conventionally, the traveling time to a skipped SF has been included in the writing time. Therefore, there is a problem in that the error of the estimated writing time has been increased. Thus, in order to highly accurately calculate the time required for a beam to move between SFs, it is important to distinguish an SF where a pattern exists from an SF where no pattern exists, and to count the number of SFs where patterns exist. However, conventionally, such a method of counting the number of SFs where patterns are arranged has not been established. Therefore, there is a problem in that the difference between the estimated writing time and the actual writing time has been increased.

BRIEF SUMMARY OF THE INVENTION

According to one aspect of the present invention, a charged particle beam writing apparatus includes a storage configured to store writing data which defines data on a chip including a plurality of figure patterns; a first mesh region setting processing circuitry configured to set, in a case where a charged particle beam is deflected such that it moves between a plurality of small regions obtained by virtually dividing a writing region of a target object into mesh-like small regions by a predetermined same size by using one deflector of multiple stage deflector, a plurality of first mesh regions obtained by virtually dividing a region of the chip into mesh-like regions by length and width sizes same as those of each of the plurality of small regions; a dividing-into-shots processing circuitry configured to divide each of the plurality of figure patterns into a plurality of shot figures by a size that can be irradiated by one shot of the charged particle beam; a shot-figure-existence determination processing circuitry configured to assign the plurality of shot figures to the plurality of first mesh regions, and determine whether a shot figure having been assigned exists in each of the plurality of first mesh regions; a merge processing circuitry configured to perform, with respect to the plurality of first mesh regions, merging of two or more adjacent first mesh regions; a measurement processing circuitry configured to measure, for each second mesh region of a plurality of second mesh regions each obtained by merging two or more first mesh regions, a number of first mesh regions each of which has been determined that the shot figure having been assigned exists therein, in a second mesh region concerned of the plurality of second mesh regions; a per-chip region-with-shot-figure number map generation processing circuitry configured to generate a region number map for each the chip, where the number of first mesh regions with the shot figure which has been measured is defined as a map value; a deflection time estimation processing circuitry configured to estimate, by using the region number map, a deflection time for deflecting the charged particle beam to move between the plurality of small regions in a case of writing the chip concerned; and a writing mechanism including a stage on which the target object is placed, a charged particle beam source, and the multiple stage deflector, configured to write the plurality of figure patterns in the chip concerned on the target object while performing multiple stage deflection of the charged particle beam by the multiple stage deflector.

According to another aspect of the present invention, a charged particle beam writing apparatus includes a storage configured to store writing data which defines data on a chip including a plurality of figure patterns; a first mesh region setting processing circuitry configured to set, in a case where a charged particle beam is deflected such that it moves between a plurality of small regions obtained by virtually dividing a writing region of a target object into mesh-like small regions by a predetermined same size by using one deflector of multiple stage deflector, a plurality of first mesh regions obtained by virtually dividing a region of the chip into mesh-like regions by length and width sizes which is n times length and width sizes of each of the plurality of small regions; a dividing-into-shots processing circuitry configured to divide each of the plurality of figure patterns into a plurality of shot figures by a size that can be irradiated by one shot of the charged particle beam; a shot-figure-existence determination processing circuitry configured to assign the plurality of shot figures to the plurality of first mesh regions, and determine whether a shot figure having been assigned exists in each of the plurality of first mesh regions; a per-chip region-with-shot-figure number map generation processing circuitry configured to generate a region number map for each the chip, where map values are n×n for the first mesh region which has been determined that the shot figure having been assigned exists therein, and 0 (zero) for the first mesh region which has been determined to include no shot figure; a deflection time estimation processing circuitry configured to estimate, by using the region number map, a deflection time for deflecting the charged particle beam to move between the plurality of small regions in a case of writing the chip concerned; and a writing mechanism including a stage on which the target object is placed, a charged particle beam source, and the multiple stage deflector, configured to write the plurality of figure patterns in the chip concerned on the target object while performing multiple stage deflection of the charged particle beam by the multiple stage deflector.

According to yet another aspect of the present invention, a charged particle beam writing method includes setting, in a case where a charged particle beam is deflected such that it moves between a plurality of small regions obtained by virtually dividing a writing region of a target object into mesh-like small regions by a predetermined same size by using one deflector of multiple stage deflector, a plurality of first mesh regions obtained by virtually dividing a region of a chip including a plurality of figure patterns into mesh-like regions by length and width sizes same as those of each of the plurality of small regions; dividing each of the plurality of figure patterns into a plurality of shot figures by a size that can be irradiated by one shot of the charged particle beam; assigning the plurality of shot figures to the plurality of first mesh regions, and determining whether a shot figure having been assigned exists in each of the plurality of first mesh regions; performing, with respect to the plurality of first mesh regions, merging of two or more adjacent first mesh regions; measuring, for each second mesh region of a plurality of second mesh regions each obtained by merging two or more first mesh regions, a number of first mesh regions each of which has been determined that the shot figure having been assigned exists therein, in a second mesh region concerned of the plurality of second mesh region; generating a map for each the chip, where the number of first mesh regions having been measured is defined as a map value; estimating, by using the map, a deflection time for deflecting the charged particle beam to move between the plurality of small regions in a case of writing the chip concerned; and writing the plurality of figure patterns in the chip concerned on the target object while performing multiple stage deflection of the charged particle beam by the multiple stage deflector.

According to yet another aspect of the present invention, a charged particle beam writing method includes setting, in a case where a charged particle beam is deflected such that it moves between a plurality of small regions obtained by virtually dividing a writing region of a target object into mesh-like small regions by a predetermined same size by using one deflector of multiple stage deflector, a plurality of first mesh regions obtained by virtually dividing a region of the chip including a plurality of figure patterns into mesh-like regions by length and width sizes which is n times length and width sizes of each of the plurality of small regions; dividing each of the plurality of figure patterns into a plurality of shot figures by a size that can be irradiated by one shot of the charged particle beam; assigning the plurality of shot figures to the plurality of first mesh regions, and determining whether a shot figure having been assigned exists in each of the plurality of first mesh regions; generating a map for each the chip, where map values are n×n for the first mesh region which has been determined that the shot figure having been assigned exists therein, and 0 (zero) for the first mesh region which has been determined to include no shot figure; estimating, by using the map, a deflection time for deflecting the charged particle beam to move between the plurality of small regions in a case of writing the chip concerned; and writing the plurality of figure patterns in the chip concerned on the target object while performing multiple stage deflection of the charged particle beam by the multiple stage deflector.

DETAILED DESCRIPTION OF THE INVENTION

In the following embodiments, there will be described a writing apparatus and method that can count with great accuracy the number of SFs where patterns exist.

In the following embodiments, there will be described a configuration in which an electron beam is used as an example of a charged particle beam. The charged particle beam is not limited to the electron beam, and other charged particle beam such as an ion beam may also be used. Moreover, a variable shaped beam writing apparatus will be described as an example of a charged particle beam apparatus.

First Embodiment

Figure 1:
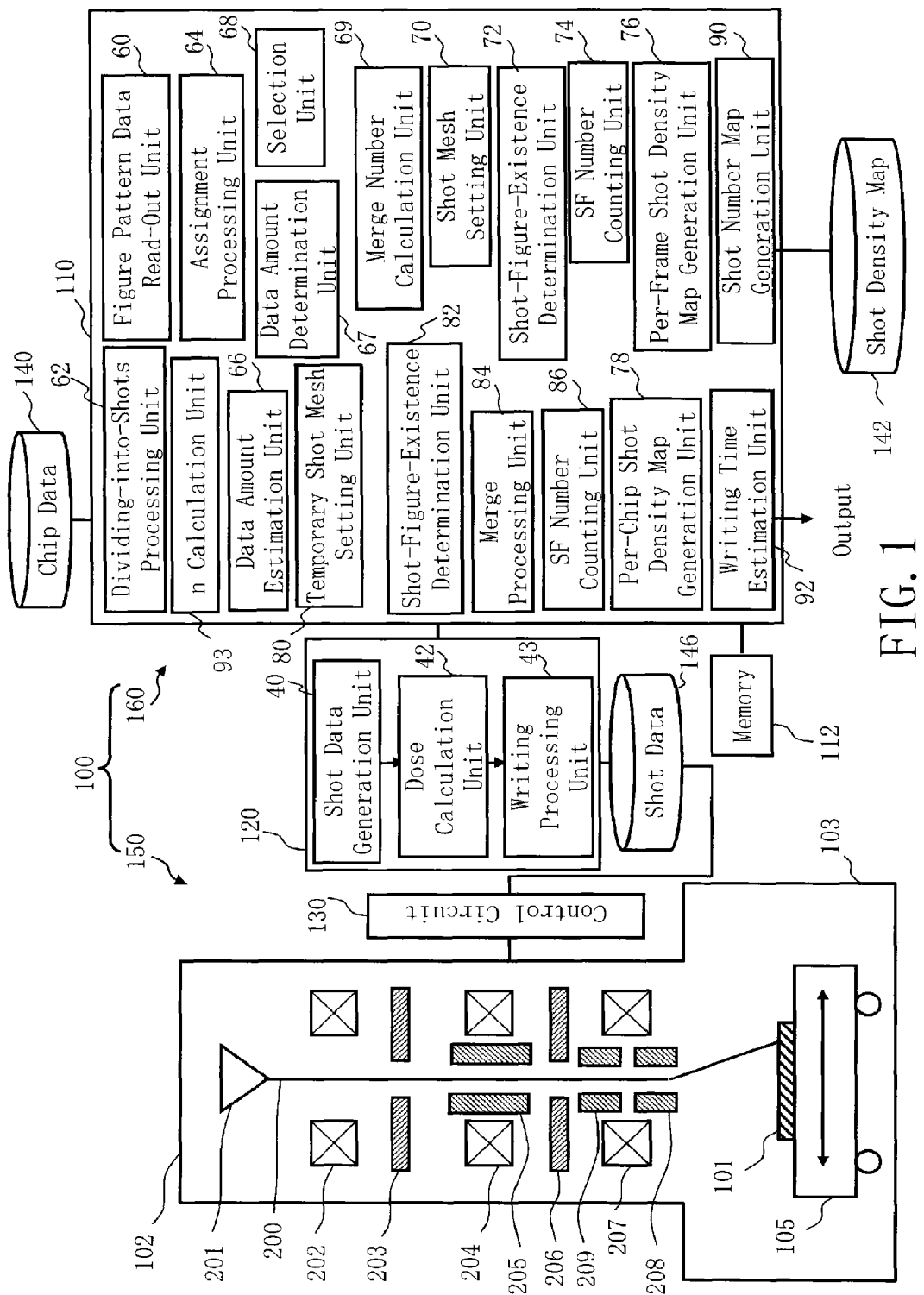
FIG. 1 is a schematic diagram showing the configuration of a writing apparatus according to a first embodiment.

FIG. 1 is a schematic diagram showing the configuration of a writing or "drawing" apparatus according to the first embodiment. As shown in FIG. 1, a writing apparatus 100 includes a writing unit 150 and a control unit 160. The writing apparatus 100 is an example of a charged particle beam writing apparatus, and especially, an example of a variable shaped beam writing apparatus. The writing unit 150 includes an electron optical column 102 and a writing chamber 103. In the electron optical column 102, there are arranged an electron gun assembly 201, an illumination lens 202, a first aperture plate 203, a projection lens 204, a deflector 205, a second aperture plate 206, an objective lens 207, a main deflector 208 and a sub deflector 209. In the writing chamber 103, an XY stage 105 is arranged. On the XY stage 105, there is placed a target object or "sample" 101 such as a mask serving as a writing target when writing is performed. For example, the target object 101 is an exposure mask used for manufacturing semiconductor devices. The target object 101 may be, for example, a mask blank on which resist has been applied and nothing has yet been written.

The control unit 160 includes control computers 110 and 120, a memory 112, a control circuit 130, and storage devices 140, 142, and 146 such as magnetic disk drives. The control computers 110 and 120, the memory 112, the control circuit 130 and the storage devices 140, 142, and 146 are connected with each other through a bus (not shown).

In the control computer 110, there are arranged a figure pattern read-out unit 60, a dividing-into-shots processing unit 62, an assignment processing unit 64, a data amount estimation unit 66, a data amount determination unit 67, a selection unit 68, a merge number calculation unit 69, a shot mesh setting unit 70, a shot-figure-existence determination unit 72, a subfield (SF) number counting unit 74, a per-frame shot density map generation unit 76, a per-chip shot density map generation unit 78, a temporary shot mesh setting unit 80, a shot-figure-existence determination unit 82, a merge processing unit 84, an SF number counting unit 86, a shot number map generation unit 90, a writing time estimation unit 92 and an n calculation unit 93. Each of the "units" such as the figure pattern read-out unit 60, the dividing-into-shots processing unit 62, the assignment processing unit 64, the data amount estimation unit 66, the data amount determination unit 67, the selection unit 68, the merge number calculation unit 69, the shot mesh setting unit 70, the shot-figure-existence determination unit 72, the subfield (SF) number counting unit 74, the per-frame shot density map generation unit 76, the per-chip shot density map generation unit 78, the temporary shot mesh setting unit 80, the shot-figure-existence determination unit 82, the merge processing unit 84, the SF number counting unit 86, the shot number map generation unit 90, the writing time estimation unit 92 and the n calculation unit 93 includes a processing circuitry. As the processing circuitry, for example, an electric circuit, a computer, a processor, a circuit board, a quantum circuit, or a semiconductor device may be used. Each of the "units" may use a common processing circuitry (same processing circuitry), or different processing circuitries (separate processing circuitries). Data which is input and output to/from the figure pattern read-out unit 60, dividing-into-shots processing unit 62, assignment processing unit 64, data amount estimation unit 66, data amount determination unit 67, selection unit 68, merge number calculation unit 69, shot mesh setting unit 70, shot-figure-existence determination unit 72, subfield (SF) number counting unit 74, per-frame shot density map generation unit 76, per-chip shot density map generation unit 78, temporary shot mesh setting unit 80, shot-figure-existence determination unit 82, merge processing unit 84, SF number counting unit 86, shot number map generation unit 90, writing time estimation unit 92 and n calculation unit 93, and data being operated are stored in the memory 112 each time.

In the control computer 120, there are arranged a shot data generation unit 40, a dose calculation unit 42, and a writing processing unit 43. Each of the "units" such as the shot data generation unit 40, the dose calculation unit 42, and the writing processing unit 43 includes a processing circuitry. As the processing circuitry, for example, an electric circuit, a computer, a processor, a circuit board, a quantum circuit, or a semiconductor device may be used. Each of the "units" may use a common processing circuitry (same processing circuitry), or different processing circuitries (separate processing circuitries). Data which is input and output to/from the shot data generation unit 40, the dose calculation unit 42, and the writing processing unit 43, and data being operated are stored in the memory (not shown) each time.

FIG. 1 shows a configuration necessary for explaining the first embodiment. Other configuration elements generally necessary for the writing apparatus 100 may also be included. For example, although a multiple stage deflector of two stages of the main deflector 208 and the sub deflector 209 is herein used for position deflection, a multiple stage deflector of three or more stages may also be used for position deflection.

Writing data that defines data of a chip including a plurality of cells each configured by at least one figure pattern is input from the outside the writing apparatus 100 into the storage device 140 (storage unit) and stored therein. Each figure pattern data indicating the shape, arrangement coordinates and size of each figure pattern is defined in the chip data. In other words, each figure pattern data indicating the shape, arrangement coordinates and size of each figure pattern in a chip including a plurality of figure patterns is defined in the chip data.

Figure 2:
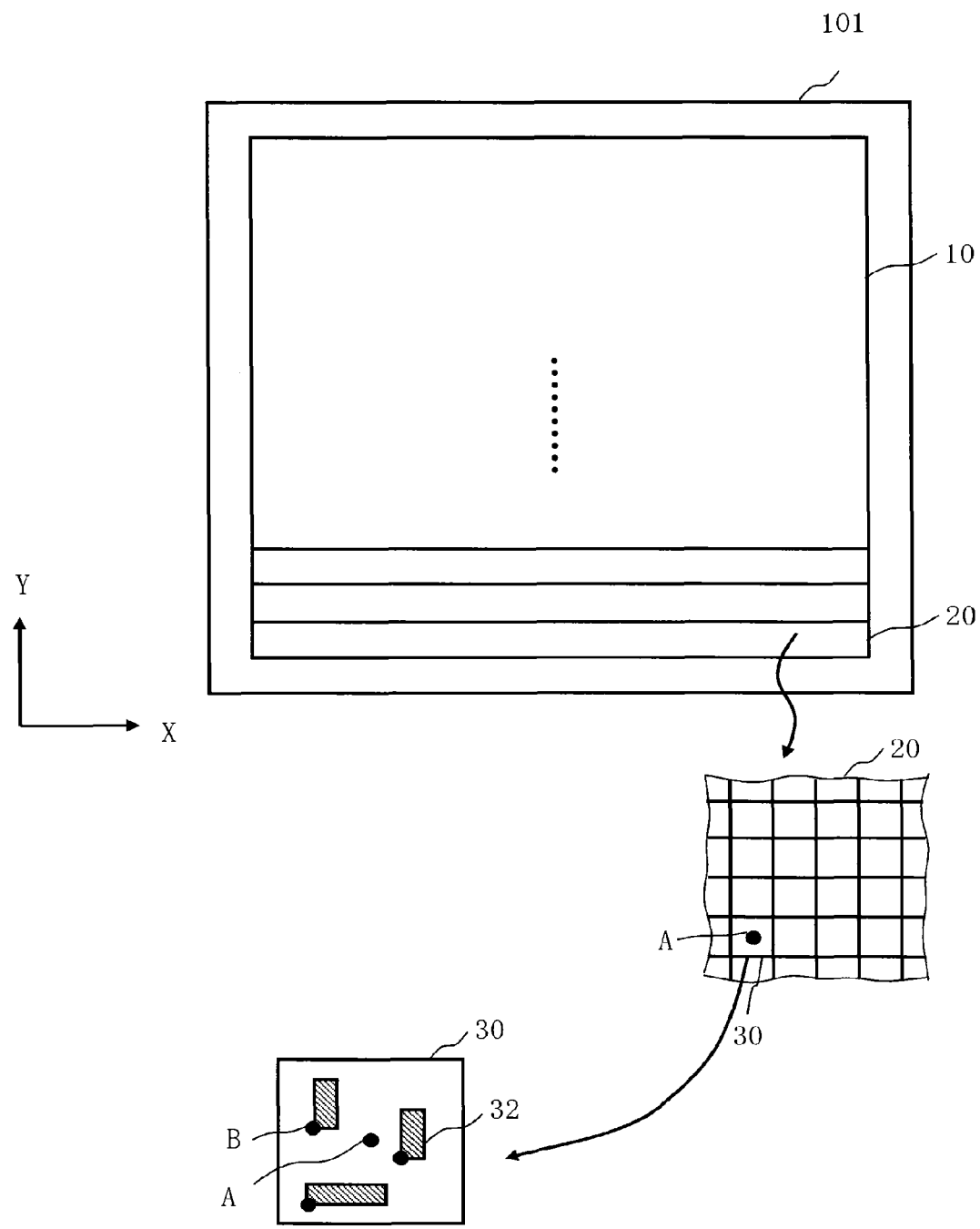
FIG. 2 is a conceptual diagram for explaining each region according to the first embodiment.

FIG. 2 is a conceptual diagram for explaining each region according to the first embodiment. As shown in FIG. 2, a writing region 10 of the target object 101 is virtually divided into a plurality of strip-shaped stripe regions 20 which are aligned along the y direction, for example, by the width deflectable by the main deflector 208. Then, each stripe region 20 is virtually divided into a plurality of mesh-like subfields (SFs) 30 (small regions) by the size deflectable by the sub deflector 209. For writing a figure pattern by the writing apparatus 100, it is necessary to divide each figure pattern defined in chip data into shot figures each having a size that can be irradiated by one beam shot. A shot FIG. 32 is written at each shot position in each SF 30.

The writing apparatus 100 performs writing processing for each stripe region 20 by using a multiple stage deflector. In this case, a two-stage deflector composed of the main deflector 208 and the sub deflector 209 is used as an example. While the XY stage 105 is continuously moving in the −x direction, for example, writing is performed in the x direction in the first stripe region 20. After the first stripe region 20 has been written, writing is performed in the same direction or in the opposite direction in the second stripe region 20. Then, similarly, writing is performed in the third and subsequent stripe regions 20. The main deflector 208 sequentially deflects the electron beam 200 to a reference position A of SF 30 such that the movement of the XY stage 105 is followed. As the reference position A, the center position of SF 30 is used, for example. Alternatively, the position of the lower left corner of SF 30 may also be used. The sub deflector 209 (second deflector) deflects a shot beam (electron beam 200), which irradiates the SF 30 concerned and has been shaped to be the shot FIG. 32, from the reference position A of each SF 30 to a desired position. Thus, the main deflector 208 and the sub deflector 209 have different size deflection regions.

In the writing apparatus 100 according to the first embodiment, as preprocessing before performing writing processing, the writing time required for writing a chip is estimated. For estimating the writing time, it is necessary to obtain the total of the time (shot time) required for writing, by the sub deflector 209, a shot figure at each shot position in an SF where a pattern is arranged, and the total of the time (deflection time) required for a beam to move (travel) between SFs. Further, it is necessary to obtain the time required for a beam to move between stripe regions. According to the first embodiment, particularly, in order to highly accurately calculate the time (deflection time) required for a beam to move between SFs, SFs where patterns (shot figures) are arranged are distinguished from SFs where no patterns (shot figures) are arranged, and the number of the SFs where patterns are arranged is counted with great accuracy. Therefore, according to the first embodiment, for each chip, a chip region is divided into shot mesh regions by a predetermined size, and a shot density map defining the number of SFs in each of which a pattern (shot figure) is arranged is generated for each shot mesh region.

Figure 3:
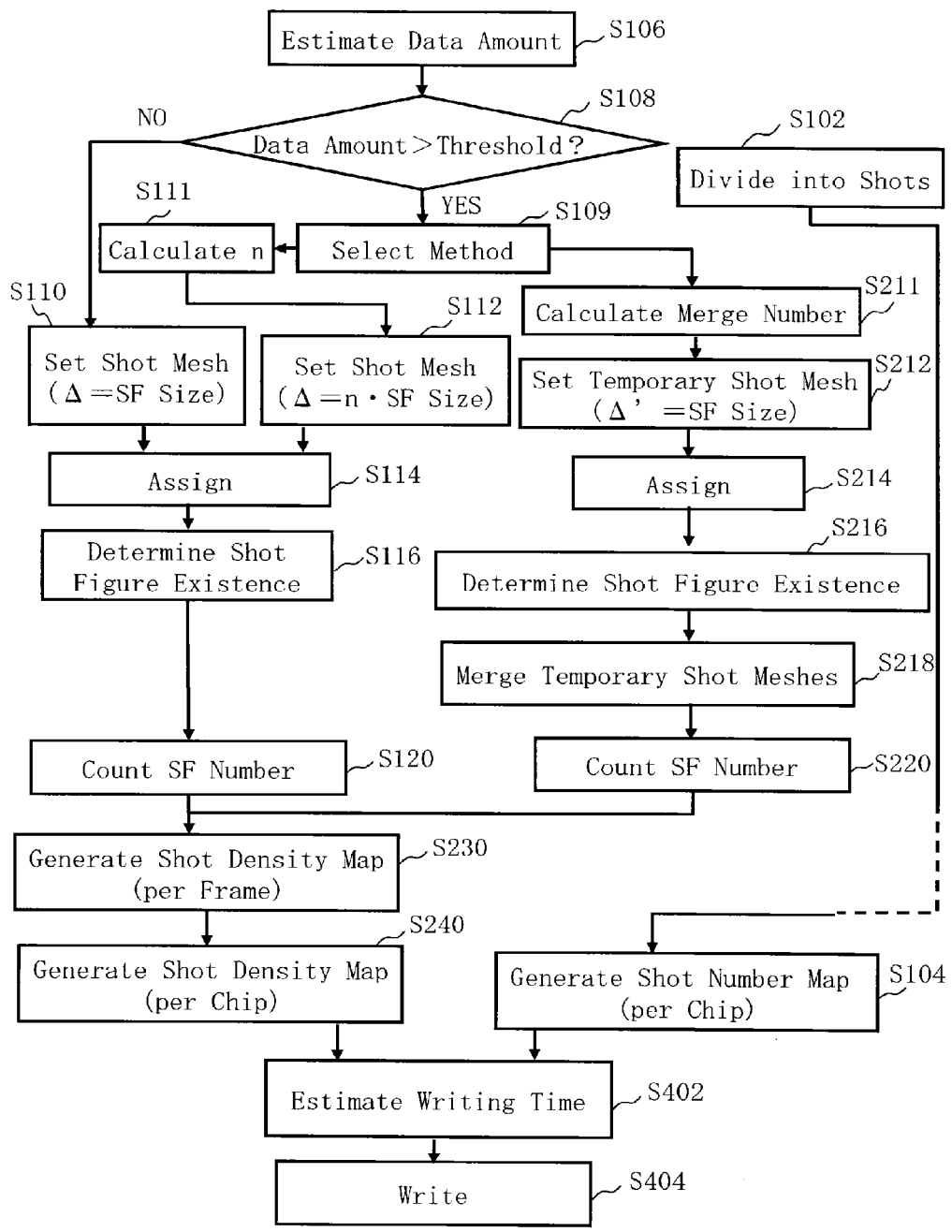
FIG. 3 is a flowchart showing main steps of a writing method according to the first embodiment.

FIG. 3 is a flowchart showing main steps of a writing method according to the first embodiment. As shown in FIG. 3, the writing method of the first embodiment executes a series of steps of a dividing-into-shots step (S102), a shot number map generation step (S104), a data amount estimation step (S106), a data amount determination step (S108), a shot mesh setting step (S110), an assignment step (S114), a shot-figure-existence determination step (S116), an SF number counting step (S120), a shot density map generation step (S230) per frame, a shot density map generation step (S240) per chip, a writing time estimation step (S402), and a writing step (S404).

Alternatively, the writing method of the first embodiment executes a series of steps of a dividing-into-shots step (S102), a shot number map generation step (S104), a data amount estimation step (S106), a data amount determination step (S108), a selection step (S109), an n calculation step (S111), a shot mesh setting step (S112), an assignment step (S114), a shot-figure-existence determination step (S116), an SF number counting step (S120), a shot density map generation step (S230) per frame, a shot density map generation step (S240) per chip, a writing time estimation step (S402), and a writing step (S404).

Alternatively, the writing method of the first embodiment executes a series of steps of a dividing-into-shots step (S102), a shot number map generation step (S104), a data amount estimation step (S106), a data amount determination step (S108), a selection step (S109), a merge number calculation step (S211), a temporary shot mesh setting step (S212), an assignment step (S214), a shot-figure-existence determination step (S216), a temporary shot mesh merge processing step (S218), an SF number counting step (S220), a shot density map generation step (S230) per frame, a shot density map generation step (S240) per chip, a writing time estimation step (S402), and a writing step (S404).

As a method of counting the number of SFs, when the data amount is less than or equal to a threshold, a method (1-1) is executed which performs each of the shot mesh setting step (S110) and the steps from the assignment step (S114) to the SF number counting step (S120). When the data amount is greater than a threshold, either one of a method (1-2) of performing each of the steps from the shot mesh setting step (S112) to the SF number counting step (S120), and a method (2) of performing each of the steps from the merge number calculation step (S211) to the SF number counting step (S220) is executed. When selecting one of the above methods, the selection determination firstly depends on the data amount. Next, either one of the method (1-2) and the method (2) is selected.

The time (shot time) required for writing a shot figure at each shot position in an SF can be obtained by multiplying the number of shot figures, that is the number of shots, by the sum of the irradiation time of a beam which has been shaped to be a shot figure and the stabilization time (settling time) of a DAC (digital-to-analog conversion) amplifier (not shown) for applying a deflection voltage to the sub deflector 209. In order to obtain the number of shots, a shot number map is generated.

In the dividing-into-shots step (S102), first, the figure pattern read-out unit 60 reads each figure pattern data in each cell in chip data. Then, the read figure pattern data is output to the dividing-into-shots processing unit 62. Next, the dividing-into-shots processing unit 62 inputs each figure pattern data in chip data, and divides each figure pattern into a plurality of shot figures by a size that can be irradiated by one shot of the electron beam 200.

The assignment processing unit 64 assigns each of the shot figures to a corresponding mesh region of a plurality of mesh regions obtained by virtually dividing the chip region by a predetermined size. The size of the mesh region may be the same as that of SF 30, or larger than the SF size.

In the shot number map generation step (S104), the shot number map generation unit 90 counts the number of shot figures having been assigned to each mesh region. This processing is performed, for example, for each frame to be described later, to generate a shot number map. Then, merging is performed per chip to generate a shot number map for each chip.

In the data amount estimation step (S106), the data amount estimation unit 66 estimates the data amount of a shot density map to be generated. Here, calculation is performed on the assumption that the size of the shot mesh region which configures the structure of the shot density map is the same as that of SF 30, for example.

Case 1: Assuming that, for example, the chip size is a 1000-μm square, the SF size is a 20-μm square, and the data amount of the map value defined in each shot mesh region (map element) is 24 bytes, the data amount of the shot density map is $(1000/20)^2 \times 24 = 60$ kB.

Case 2: Assuming that, for example, the chip size is a 150000-µm square, the SF size is a 10-µm square, and the data amount of the map value defined in each shot mesh region (map element) is 24 bytes, the data amount of the shot density map is $(150000/10)^2 \times 24 = 5.4$ GB.

In the data amount determination step (S108), the data amount determination unit 67 determines whether the data amount of the shot density map is larger than a preset threshold. When the data amount of the shot density map is larger than the preset threshold, it proceeds to the selection step (S109).

In the selection step (S109), when the data amount of the shot density map is larger than the preset threshold, the selection unit 68 selects one of the methods (1-2) and (2).

When the data amount of the shot density map is less than or equal to the preset threshold, it proceeds to the shot mesh setting step (S110). In other words, the method (1-1) is selected. For example, with respect to the cases described above, if the threshold is 1 GB, since the case 1 is less than the threshold, the method (1-1) is selected. On the other hand, since the case 2 is greater than the threshold, the method (1-2) or (2) is selected.

In the shot mesh setting step (S110), the shot mesh setting unit 70 (an example of a first mesh region setting unit) sets a plurality of shot mesh regions (an example of a first mesh region) by virtually dividing the chip region into mesh-like regions by the length and width sizes being n times (however, n=1) the length and width sizes of SF 30, in other words, by the same size as SF 30. In the writing processing, as described above, the main deflector 208 which is one of the multiple stage deflector deflects an electron beam to move (travel) between a plurality of SFs 30 (small regions) obtained by virtually dividing the writing region 10 of the target object 101 into mesh-like small regions by a predetermined same size. According to the method (1-1), the shot mesh region is set by using the size being n times (however, n=1) the SF 30.

In the n calculation step (S111), the n calculation unit 93 calculates the value n for setting a shot mesh region such that the data amount of the shot density map is less than or equal to the preset threshold. The value n is preferably calculated in each writing processing.

In the shot mesh setting step (S112), the shot mesh setting unit 70 (an example of the first mesh region setting unit) sets a plurality of shot mesh regions (an example of the first mesh region) by virtually dividing the chip region into mesh-like regions by the size being n times the width size of SF 30. In the writing processing, as described above, the main deflector 208 which is one of the multiple stage deflector deflects an electron beam to move (travel) between a plurality of SFs 30 (small regions) obtained by virtually dividing the writing region 10 of the target object 101 into mesh-like small regions by a predetermined same size. According to the method (1-2), the shot mesh region is set by using the size being n times (n>1, n being a real number, for example, an integer) the SF 30. The method (1-2) will be described below. The method (1-1) is the same as the case of n=1 in the method (1-2).

Figure 4:
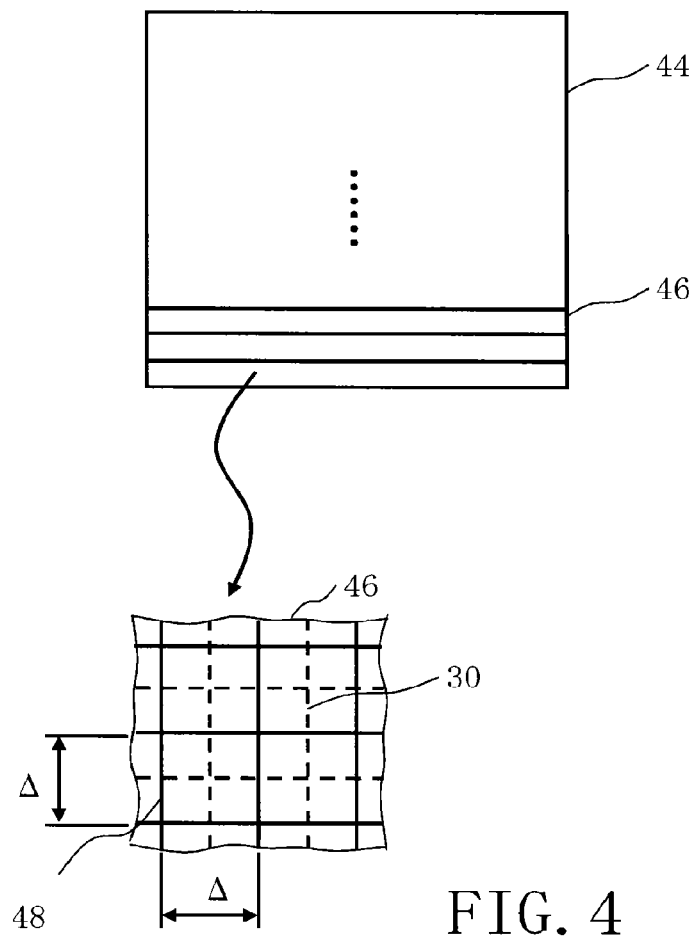
FIG. 4 illustrates a shot mesh region according to the first embodiment.

FIG. 4 illustrates a shot mesh region according to the first embodiment. As shown in FIG. 4, a chip 44 is virtually divided into a plurality of strip-like frame regions 46, for example. Then, each frame region 46 is virtually divided into a plurality of shot mesh regions 48 by the length and width sizes being n times the length and width sizes of SF 30, (that is, the size being $\Delta = n \times SF$ size). FIG. 4 shows the case in which n=2.

In the assignment step (S114), the assignment processing unit 64 assigns a plurality of shot FIG. 32 to a plurality of shot mesh regions 48. With respect to the shot FIG. 32, the data that was generated in the dividing-into-shots processing may be used.

In the shot-figure-existence determination step (S116), the shot-figure-existence determination unit 72 determines whether an assigned shot FIG. 32 exists in each shot mesh region 48.

In the SF number counting step (S120), the SF number counting unit 74 calculates the value n×n for the shot mesh region 48 which has been determined that a shot figure exists therein, and counts it as the number of SFs. As for the shot mesh region 48 which has been determined that no shot figure exists therein, the value of the number of SFs is zero. In the case of FIG. 4, with respect to the shot mesh region 48 having been determined that a shot figure exists therein, the number of SFs is 4 (=2×2).

In the shot density map generation step (S230) per frame, the per-frame shot density map generation unit 76 (per-frame region-with-shot-figure number map generation unit) generates a shot density map (region number map defining the number of mesh regions with a shot figure per frame) for each frame region 46, where n×n is a map value of the shot mesh region 48 having been determined that a shot figure exists therein, and 0 (zero) is a map value of the shot mesh region 48 having been determined that no shot figure exists therein.

In the shot density map generation step (S240) per chip, the per-chip shot density map generation unit 78 (per-chip region-with-shot-figure number map generation unit) performs merging of the shot density map for each frame region 46, and generates a shot density map (region number map defining the number of mesh regions with a shot figure per chip) for each chip 44.

Figure 5:
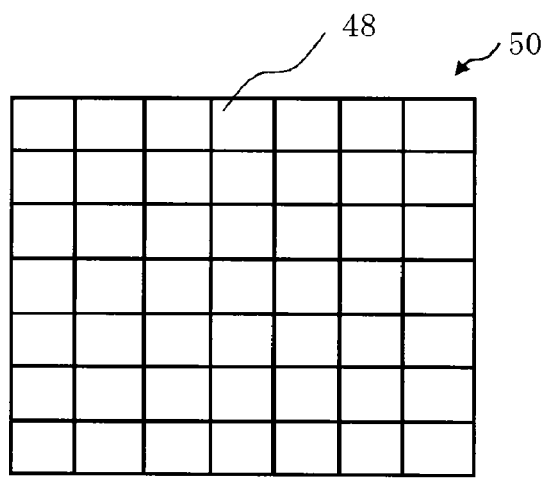
FIG. 5 shows an example of a shot density map according to the first embodiment.

FIG. 5 shows an example of the shot density map according to the first embodiment. As shown in FIG. 5, a per-chip shot density map 50 is generated where the shot mesh regions 48 are elements of the map. As map values defined in the shot density map for each chip 44, n×n for the shot mesh region 48 having been determined that a shot figure exists therein, and 0 (zero) for the shot mesh region 48 having been determined that no shot figure exists therein are defined.

Since the SF size can be variably set in each writing processing, it is preferable to set the value n to be variable in each writing processing. The closer to n=1, the higher the accuracy becomes. Also, it is preferable to take the pattern area density into account when counting the number of SFs. For example, pattern area density p of a shot figure assigned in the shot mesh region 48 is calculated using a pattern area density calculation unit (not shown). Then, the value calculated by multiplying an obtained number of SFs by the pattern area density p shall be the number of SFs to be defined in the shot density map. For example, the number of SFs can be obtained by n×n×p (namely, SF number=n×n×p). Thereby, it is possible to obtain the number of SFs with greater accuracy.

As described above, a shot density map is generated for each chip in the method (1) (methods (1-1) and (1-2)). According to the method (1), the number of processing steps is fewer than that of the method (2) to be described later, and thus, a map can be generated in a shorter time. Therefore, when the SF size is large or when the chip size is small, since the value n can be closer to 1, the method (1) becomes particularly effective. Then, especially when the data amount is less than or equal to a threshold, since the value n can be 1, the method (1-1) becomes particularly effective. However, when the SF size is small or when the chip size is large, the data amount of the shot density map becomes large. In that case, it becomes necessary to increase the value n in order to suppress the data amount. Thus, the method (1-2) in which the value n is set to a value greater than 1 can be used. However, according to the method (1-2), for example, when it is set to be n=4, the shot mesh region 48 is composed of sixteen SFs 30. In the case where a shot figure is assigned to only one SF 30 in the sixteen SFs 30, although the number of SFs should basically be 1, it is counted as sixteen according to the method (1-2). Therefore, if the value n is increased, the error becomes large in accordance with the increase. Accordingly, although it is acceptable to use the method (1-2), if the data amount becomes large by using the method (1-2), another method (2) is recommended as being more effective due to less errors than those of the method (1-2) even if the number of steps is increased. Thus, according to the first embodiment, by executing the data amount determination step (S108) and the selection step (S109) described above, a more suitable method can be selected. Next, the method (2) is described below.

In the merge number calculation step (S211), the merge number calculation unit 69 calculates, (as a merge number), the number of temporary shot mesh regions (an example of the first mesh region) for merging in the temporary shot mesh merge processing step (S218) to be described later. As the merge number, it is preferable to calculate a value so that the data amount of the shot density map may be less than or equal to the threshold described above.

In the temporary shot mesh setting step (S212), the temporary shot mesh setting unit 80 (an example of the first mesh region shot mesh setting unit) sets a plurality of temporary shot mesh regions (an example of the first mesh region) by virtually dividing the region of the chip 44 into mesh-like regions by the width size being the same as the SF size.

Figure 6:
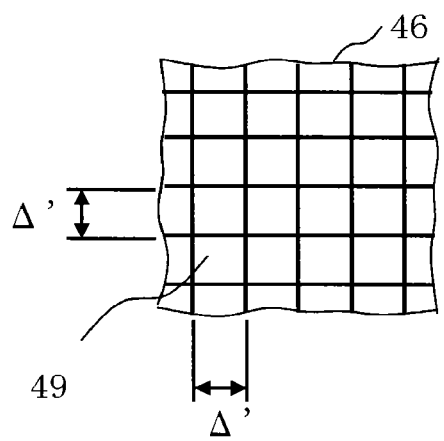
FIG. 6 illustrates a temporary shot mesh region according to the first embodiment.

FIG. 6 illustrates a temporary shot mesh region according to the first embodiment. As shown in FIG. 6, as described above, the chip 44 is virtually divided into a plurality of strip-like frame regions 46, for example. Then, each frame region 46 is virtually divided into a plurality of temporary shot mesh regions 49 by the size ($\Delta'$=SF size) being the same as the width size of SF 30.

In the assignment step (S214), the assignment processing unit 64 assigns a plurality of shot FIG. 32 to a plurality of temporary shot mesh regions 49. With respect to the shot FIG. 32, the data that was generated in the dividing-into-shots processing may be used. The shot FIG. 32 is assigned to the temporary shot mesh region 49 where the reference point B (point B shown in FIG. 2) of the shot FIG. 32 concerned is located.

In the shot-figure-existence determination step (S216), the shot-figure-existence determination unit 82 determines whether an assigned shot FIG. 32 exists in each temporary shot mesh region 49.

In the temporary shot mesh merge processing step (S218), the merge processing unit 84 performs merging of each two or more adjacent temporary shot mesh regions 49 in a plurality of temporary shot mesh regions 49.

Figure 7:
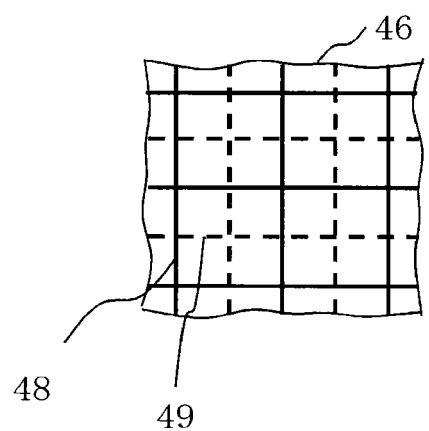
FIG. 7 illustrates a temporary shot mesh region and a shot mesh region after merge processing according to the first embodiment.

FIG. 7 illustrates a temporary shot mesh region and a shot mesh region after merge processing according to the first embodiment. FIG. 7 shows the case where merging is performed for each two temporary shot mesh regions 49 in the x and y directions, as the merge number. Therefore, one shot mesh region 48 is composed of 2×2 temporary shot mesh regions 49.

In the SF number counting step (S220), for each shot mesh region 48 in a plurality of shot mesh regions 48 (an example of the second mesh region) each obtained by merging two or more temporary shot mesh regions 49, the SF number counting unit 86 (measurement unit) measures (counts), in the shot mesh region 48 concerned, the number of temporary shot mesh regions 49 each of which has been determined that the shot FIG. 32 exists therein. When one shot mesh region 48 is composed, for example, of four (2×2) temporary shot mesh regions 49, if the shot FIG. 32 is arranged in each of three temporary shot mesh regions 49 in the four temporary shot mesh regions 49, the number of SFs is three. If the shot FIG. 32 is arranged in one temporary shot mesh regions 49 in the four temporary shot mesh regions 49, the number of SFs is one. Thus, it is possible to highly accurately count the number of SFs in each of which the shot FIG. 32 is arranged.

In the shot density map generation step (S230) per frame, the per-frame shot density map generation unit 76 (per-frame region-with-shot-figure number map generation unit) generates a shot density map (region number map defining the number of mesh regions with a shot figure per frame) for each frame region 46, where the measured number of temporary shot mesh regions 49 in each shot mesh region 48 is individually used as a map value.

In the shot density map generation step (S240) per chip, the per-chip shot density map generation unit 78 (per-chip region-with-shot-figure number map generation unit) generates a shot density map (region number map defining the number of first mesh regions with a shot figure per chip) for each chip 44 by performing merging of the shot density map for each frame region 46. As shown in FIG. 5, the per-chip shot density map 50 is generated where the shot mesh regions 48 are elements of the map. As a map value defined in the shot density map for each chip 44, the number of temporary shot mesh regions 49 having been measured for each shot mesh region 48 is defined.

According to the method (2), the data amount of the shot density map 50 can be reduced because the number of configuration elements (shot mesh region 48) of the map can be decreased by performing merging, in addition to that highly accurate number of SFs can be counted similarly to the case of n=1 in the method (1).

In the writing time estimation step (S402), the writing time estimation unit 92 estimates the writing time required for writing the chip concerned, using the shot density map and shot number map for each chip 44. The writing time can be calculated as the sum of the total time of shot cycles each required for writing each shot FIG. 32, the total time of each deflection time for a beam to move (travel) between SFs 30, the total time of the stage movement time for a beam to move between stripe regions, etc.

The total time Ts of shot cycles can be calculated (estimated) by the equation (1) described below, that is, calculated as a value obtained by multiplying total shot number Ntotal by the sum of an irradiation time t' of each beam shot and a stabilization time (settling time) ts of a DAC amplifier (not shown) for applying a deflection voltage to the sub deflector 209. The total shot number Ntotal can be calculated as the total of map values of shot number maps each for each chip 44. The irradiation time t' can be variable for each shot by correcting the proximity effect, etc., and, here, it should be approximated by the maximum irradiation time of one shot. The settling time ts may be a constant value.

$$Ts = (t' + ts) \cdot N\text{total} \quad (1)$$

The total time (deflection time) Td, which is the total of each deflection time required for a beam to move between SFs 30 can be calculated (estimated) by the equation (2) described below, that is, calculated as a value obtained by multiplying a stabilization time (settling time) ts' of a DAC amplifier (not shown) for applying a deflection voltage to the main deflector 208 by an SF number Nsf being the number of SFs in each of which the shot FIG. 32 is arranged. The SF number Nsf can be calculated as the total of map values of shot number maps each for each chip 44. Thus, the writing time estimation unit 92 (an example of a deflection time estimation unit) estimates, using the shot density map 50, a deflection time for the main deflector 208 to deflect the beam to move between a plurality of SFs 30 in order to write the chip 44 concerned.

$$Td = ts' \cdot Nsf \quad (2)$$

Therefore, assuming that the total time of the stage movement time to move (travel) the beam between stripe regions is ΔT, the writing time T for writing the chip concerned can be calculated (estimated) by the equation (3) described below.

$$T = Ts + Td + \Delta T \quad (3)$$

Thus, it is possible to estimate further highly precise writing time by estimating a deflection time based on the SF number with great accuracy as described above. The estimated writing time is output to, for example, a monitor, a printer, a storage device, which are not shown, or the outside to be recognized by a user.

After estimating the writing time, writing processing is actually proceeded for the chip.

In the shot data generating step, the shot data generation unit 40 reads out chip data from the storage device 140, and performs data conversion processing of several steps in order to generate shot data unique to the apparatus. As described above, for writing a figure pattern by the writing apparatus 100, it is necessary to divide each figure pattern defined in the writing data into the pattern size that can be irradiated by one shot beam. Therefore, for actual writing, the shot data generation unit 40 divides each figure pattern so as to have the pattern size which can be irradiated by one beam shot, in order to generate a shot figure. Then, shot data is generated for each shot figure. In the shot data, figure data, such as a figure type, a figure size, and an irradiation position, is defined. The generated shot data is stored in the storage device 146.

In the dose calculation step, the dose calculation unit 42 calculates a dose for each mesh region of a predetermined size. The dose can be calculated by multiplying a base dose Dbase by a correction coefficient. It is preferable to use as the correction coefficient, for example, a fogging-effect correction irradiation coefficient Df(ρ) which is for correcting a fogging effect. The fogging-effect correction irradiation coefficient Df(ρ) is a function depending on a pattern density ρ of a mesh of meshes used in calculation for correcting the fogging-effect. Since the influence radius of the fogging-effect is several mm, it is preferable for the size of the mesh for correcting the fogging-effect to be approximately 1/10 of the influence radius, for example, to be 1 mm, in order to perform correction calculation. As the pattern density ρ of the mesh for correcting the fogging-effect, the pattern density calculated in each hierarchy mentioned above can be used. In addition, for correcting a dose, it is also preferable to use a correction coefficient for proximity effect correction, a correction coefficient for loading correction, etc. Also in such correction, the pattern density in the mesh region for each calculation can be used. As to such pattern density, the pattern density calculated in each hierarchy mentioned above may also be used. The dose calculation unit 42 generates a dose map in which each calculated dose is defined for each region. As described above, according to the first embodiment, since a highly precise pattern density ρ can also be obtained as the pattern density ρ used when performing dose correction, it is possible to calculate a highly accurately corrected dose. The generated dose map is stored in the storage device 146.

In the writing step (S404), the writing processing unit 43 outputs a control signal to the control circuit 130 in order to perform writing processing. The control circuit 130 inputs shot data and a dose map from the storage device 146, and controls the writing unit 150 based on the control signal from the writing processing unit 43. The writing unit 150 writes a plurality of figure patterns of the chip concerned, on the target workpiece 100 while multistage deflection is performed by the multiple stage deflector of the main deflector 208 and the sub deflector 209. Specifically, the operation is performed as described below.

The electron beam 200 emitted from the electron gun 201 (emission unit) irradiates the entire first aperture plate 203 having a quadrangular opening by the illumination lens 202. At this point, the electron beam 200 is shaped to be a quadrangle. Then, after passing through the first aperture plate 203, the electron beam 200 of a first aperture image is projected onto the second aperture plate 206 by the projection lens 204. The first aperture image on the second aperture plate 206 is deflection-controlled by the deflector 205 so as to change the shape and size of the beam to be variably shaped. After passing through the second aperture plate 206, the electron beam 200 of a second aperture image is focused by the objective lens 207 and deflected by the main deflector 208 and the sub deflector 209 so as to reach a desired position on the target object 101 placed on the XY stage 105 which moves continuously. FIG. 1 shows the case of using multiple stage deflection of two stages of the main and sub deflectors for position deflection. In such a case, the electron beam 200 of the shot concerned should be deflected to a reference position A in SF 30 by the main deflector 208 while following the movement of the stage, and the beam of the shot concerned should be deflected to each irradiation position in the SF 30 by the sub deflector 209.

As described above, according to the first embodiment, the number of SFs in each of which the shot FIG. 32 is shot can be counted highly accurately. Accordingly, the deflection time required for performing deflection between a plurality of SFs can be estimated with great accuracy.

Second Embodiment

In the method (2) according to the first embodiment, the shot mesh region 48 is set by performing merging of the temporary shot mesh regions 49 each having the same size as SF 30, and the number of the temporary shot mesh regions 49, in each of which a pattern is arranged, in the shot mesh region 48 is counted. This processing is carried out for each frame region 46, and then, merging is performed for each chip 44. In this processing, the error described below may arise.

Figure 8:
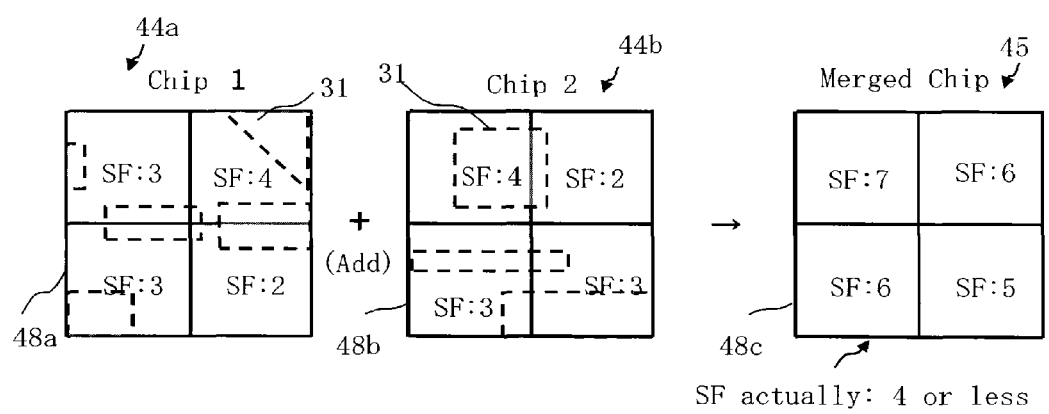
FIG. 8 shows an example of a shot density map for illustrating an error of an SF number in a comparative example to the second embodiment.

FIG. 8 shows an example of a shot density map for illustrating an error of the SF number in a comparative example to the second embodiment. The method (2) according to the first embodiment is used as a comparative example shown in FIG. 8. Writing processing may be performed in the writing apparatus 100 by using a merged chip (virtual chip) obtained by merging a plurality of chips. FIG. 8 shows the case of counting the number of SFs of a merged chip 45 (virtual chip) which is obtained by merging a chip 44a (component chip 1 of the virtual chip) and a chip 44b (component chip 2 of the virtual chip). The region of the chip 44a is virtually divided into a plurality of shot mesh regions 48a. A figure pattern 31 is arranged in each shot mesh region 48a. Although the figure pattern 31 before being divided is here shown, it should be understood that divided shot figures have already been assigned when the number of SFs is counted. Each shot mesh region 48a is composed, for example, of four (2×2) temporary shot mesh regions 49. Similarly, the region of the chip 44b is virtually divided into a plurality of shot mesh regions 48b. The figure pattern 31 is arranged in each shot mesh region 48b. Each shot mesh region 48b is composed, for example, of four (2×2) temporary shot mesh regions 49. Since the temporary shot mesh region 49 and the SF 30 have the same size, it is denoted as "SF" instead of the temporary shot mesh region 49 in the case of FIG. 8.

With respect to the shot density map of the chip 44a, FIG. 8 shows that the number of the temporary shot mesh regions 49 each having been determined to include a shot figure is defined, for example, to be three (SF:3) in the lower left shot mesh region 48a. Similarly, it shows that the number of the temporary shot mesh regions 49 each having been determined to include a shot figure is defined, for example, to be two (SF:2) in the lower right shot mesh region 48a. Similarly, it shows that the number of the temporary shot mesh regions 49 each having been determined to include a shot figure is defined, for example, to be three (SF:3) in the upper left shot mesh region 48a. Similarly, it shows that the number of the temporary shot mesh regions 49 each having been determined to include a shot figure is defined, for example, to be four (SF:4) in the upper right shot mesh region 48a.

With respect to the shot density map of the chip 44b, FIG. 8 shows that the number of the temporary shot mesh regions 49 each having been determined to include a shot figure is defined, for example, to be three (SF:3) in the lower left shot mesh region 48b. Similarly, it shows that the number of the temporary shot mesh regions 49 each having been determined to include a shot figure is defined, for example, to be three (SF:3) in the lower right shot mesh region 48b. Similarly, it shows that the number of the temporary shot mesh regions 49 each having been determined to include a shot figure is defined, for example, to be four (SF:4) in the upper left shot mesh region 48b. Similarly, it shows that the number of the temporary shot mesh regions 49 each having been determined to include a shot figure is defined, for example, to be two (SF:2) in the upper right shot mesh region 48b.

When the chip 44a and the chip 44b are merged, with respect to the shot density map of the merged chip 45, the number of the temporary shot mesh regions 49 each having been determined to include a shot figure comes to six (SF:6) for the lower left shot mesh region 48c. Similarly, the number of the temporary shot mesh regions 49 each having been determined to include a shot figure comes to five (SF:5) for the lower right shot mesh region 48c. Similarly, the number of the temporary shot mesh regions 49 each having been determined to include a shot figure comes to seven (SF:7) for the upper left shot mesh region 48c. Similarly, the number of the temporary shot mesh regions 49 each having been determined to include a shot figure comes to six (SF:6) for the upper right shot mesh region 48c. However, even with respect to the shot density map of the merged chip 45 after being merged, each shot mesh region 48c is composed, for example, of four (2×2) temporary shot mesh regions 49. Therefore, the number of SFs which each shot mesh region 48c can have should be four or less.

Thus, in the case where the shot mesh regions 48 overlap with each other, an error occurs in the number of SFs defined in the shot density map. Although FIG. 8 shows an example of the error of the shot mesh regions 48 which overlap with each other when a plurality of chips are merged together, a similar error may also occur with respect to the shot mesh regions 48 which overlap with each other at the boundary between adjacent frame regions 46 in each chip 44. Then, according to the second embodiment, a configuration for correcting such an error will be described.

Figure 9:
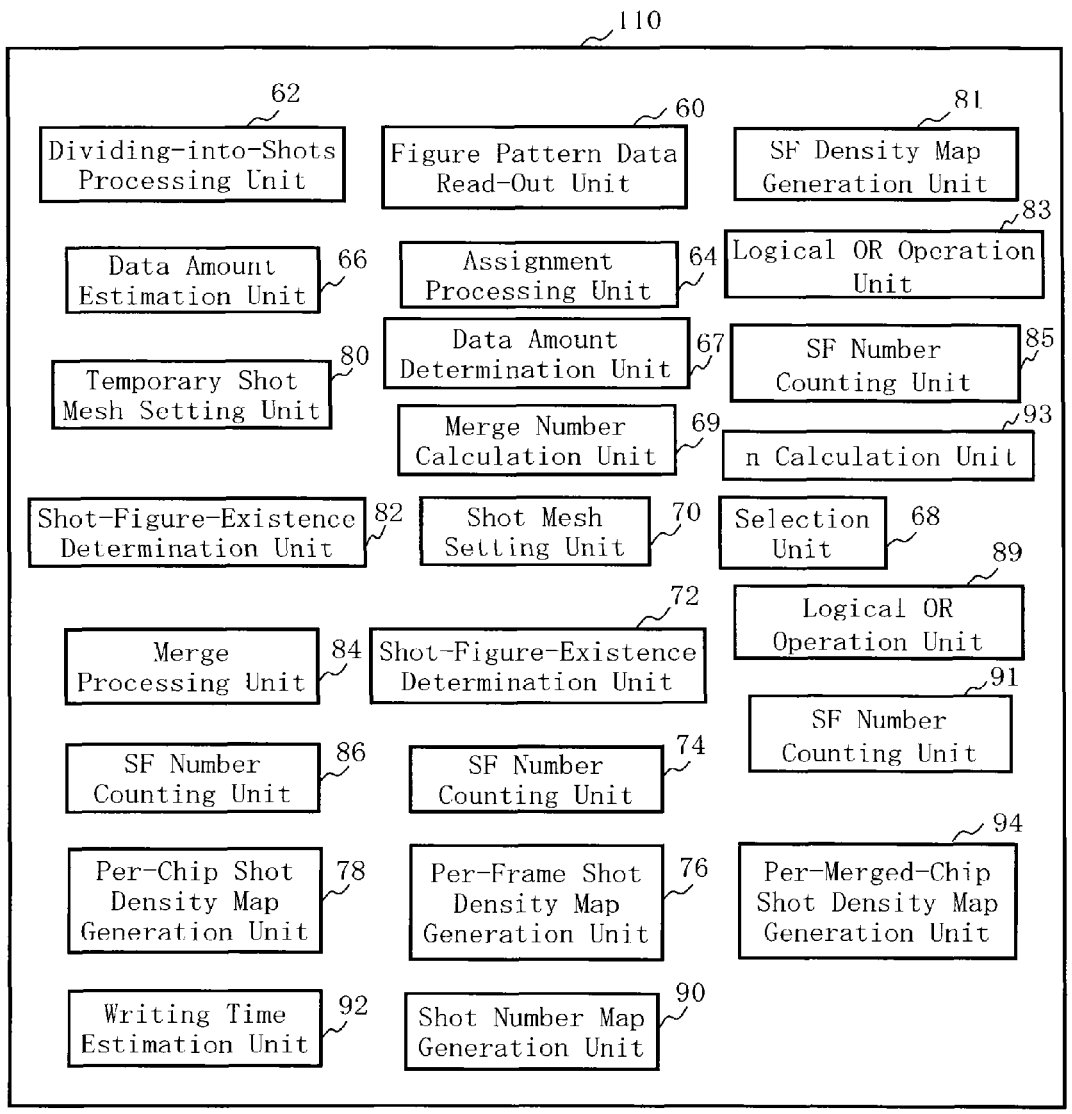
FIG. 9 shows the internal configuration of a control computer according to the second embodiment.

FIG. 9 shows the internal configuration of a control computer according to the second embodiment. The configuration of the writing apparatus 100 of FIG. 9 is the same as that of FIG. 1 except that an SF density map generation unit 81, a logical OR operation unit 83, an SF number counting unit 85, a logical OR operation unit 89, an SF number counting unit 91, and a per-merged-chip shot density map generation unit 94 are added in the control computer 110.

Each of the "units" such as the figure pattern read-out unit 60, the dividing-into-shots processing unit 62, the assignment processing unit 64, the data amount estimation unit 66, the data amount determination unit 67, the selection unit 68, the merge number calculation unit 69, the shot mesh setting unit 70, the shot-figure-existence determination unit 72, the subfield (SF) number counting unit 74, the per-frame shot density map generation unit 76, the per-chip shot density map generation unit 78, the temporary shot mesh setting unit 80, the shot-figure-existence determination unit 82, the merge processing unit 84, the SF number counting unit 86, the shot number map generation unit 90, the writing time estimation unit 92, the SF density map generation unit 81, the logical OR operation unit 83, the SF number counting unit 85, the logical OR operation unit 89, the SF number counting unit 91, the n calculation unit 93, and the per-merged-chip shot density map generation unit 94 includes a processing circuitry. As the processing circuitry, for example, an electric circuit, a computer, a processor, a circuit board, a quantum circuit, or a semiconductor device may be used. Each of the "units" may use a common processing circuitry (same processing circuitry), or different processing circuitries (separate processing circuitries). Data which is input and output to/from the figure pattern read-out unit 60, the dividing-into-shots processing unit 62, the assignment processing unit 64, the data amount estimation unit 66, the data amount determination unit 67, the selection unit 68, the merge number calculation unit 69, the shot mesh setting unit 70, the shot-figure-existence determination unit 72, the subfield (SF) number counting unit 74, the per-frame shot density map generation unit 76, the per-chip shot density map generation unit 78, the temporary shot mesh setting unit 80, the shot-figure-existence determination unit 82, the merge processing unit 84, the SF number counting unit 86, the shot number map generation unit 90, the writing time estimation unit 92, the SF density map generation unit 81, the logical OR operation unit 83, the SF number counting unit 85, the logical OR operation unit 89, the SF number counting unit 91, the n calculation unit 93 and the permerged-chip shot density map generation unit 94, and data being operated are stored in the memory 112 each time.

Figure 10:
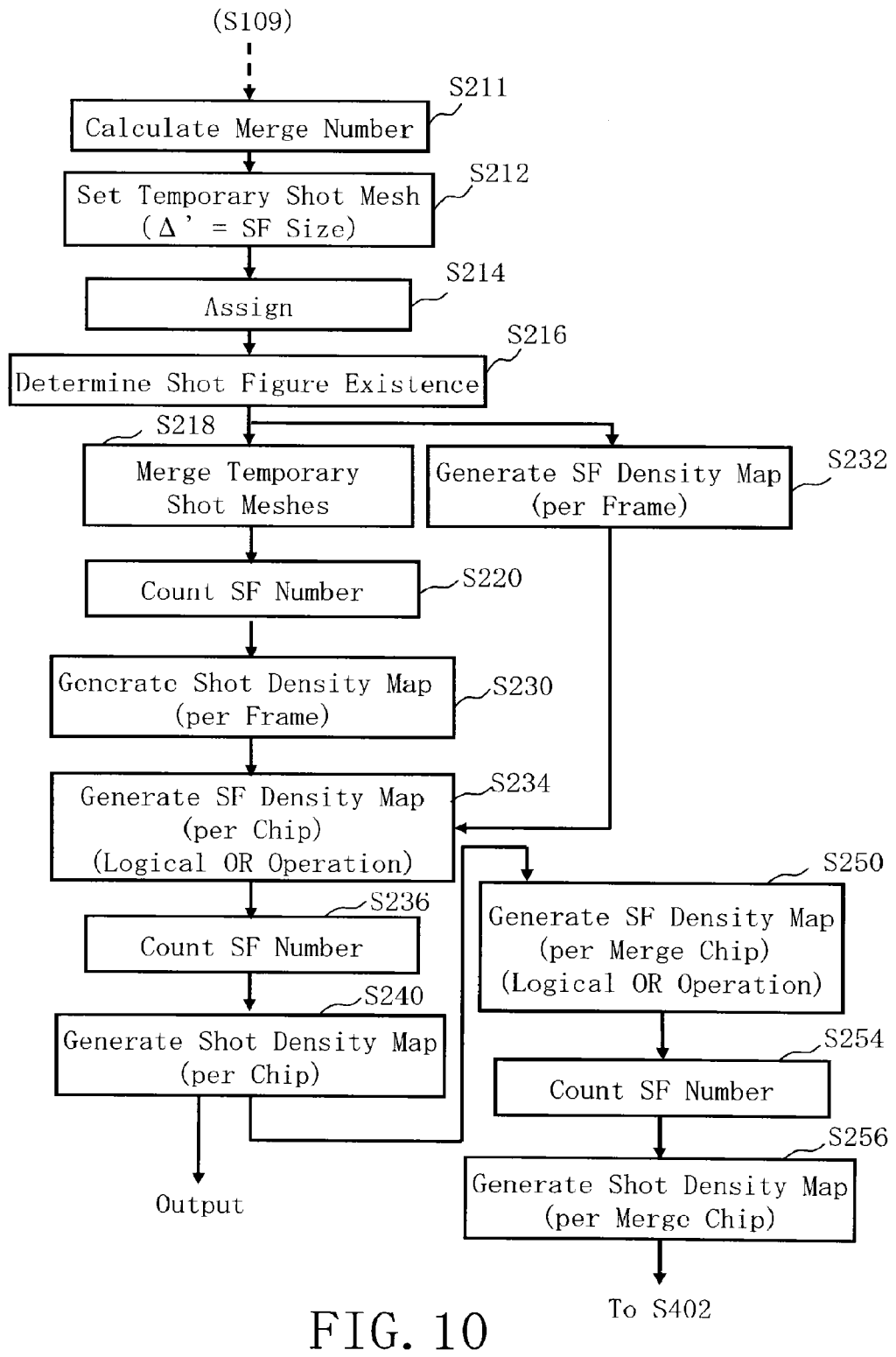
FIG. 10 is a flowchart showing some of main steps of a writing method according to the second embodiment.

FIG. 10 is a flowchart showing some of main steps of a writing method according to the second embodiment. FIG. 10 is the same as FIG. 3 except that an SF density map generation step (S232) per frame is added after the shot-figure-existence determination step (S216) in the flow of the method (2), an SF density map generation step (logical OR operation step) (S234) per chip and an SF number counting step (S236) are added between the shot density map generation step (S230) per frame and the shot density map generation step (S240) per chip, and an SF density map generation step (logical OR operation step) (S250) per merged chip, an SF number counting step (S254), and a shot density map generation step (S256) per merged chip are added between the shot density map generation step (S240) per chip and the writing time estimation step (S402). The contents of the second embodiment are the same as those of the first embodiment except for what is specifically described below.

The contents of each of the dividing-into-shots step (S102), the shot number map generation step (S104), the data amount estimation step (S106), and the data amount determination step (S108) are the same as those of the first embodiment. Moreover, the contents of each step from the shot mesh setting step (S112) to the SF number counting step (S120) of the method (1) are the same as those of the first embodiment. Further, the contents of each step from the merge number calculation step (S211) to the shot-figure-existence determination step (S216) of the method (2) are the same as those of the first embodiment.

In the SF density map generation step (S232) per frame, the SF density map generation unit 81 (shot-figure-existence determination map generation unit) generates an SF density map (shot-figure-existence determination map) for the temporary shot mesh region 49 (an example of the first mesh region), where 1 is map value of the temporary shot mesh region 49 which has been determined that a shot figure exists therein, and 0 (zero) is a map value of the temporary shot mesh region 49 which has been determined that no shot figure exists therein. Here, first, an SF density map (shot-figure-existence determination map) per frame is generated. Whether a shot figure exists or not is determined in the temporary shot mesh region 49 in which the reference point B (point B shown in FIG. 2) of each shot FIG. 32 is located.

Figure 11:
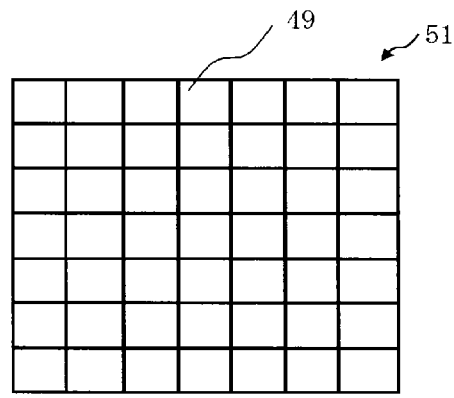
FIG. 11 shows an example of an SF density map according to the second embodiment.

FIG. 11 shows an example of the SF density map according to the second embodiment. As shown in FIG. 11, with respect to the SF density map 51 per frame, a plurality of temporary shot mesh regions 49 (an example of the first mesh region) are map elements in the frame region 46. When a shot figure exists in the temporary shot mesh region 49, 1 is defined, and when it does not exist, 0 (zero) is defined.

The contents of each of the temporary shot mesh merge processing step (S218), the SF number counting step (S220), and the shot density map generation step (S230) per frame are the same as those of the first embodiment.

In the SF density map generation step (logical OR operation step) (S234) per chip, the logical OR operation unit 83 performs merging of the SF density map of each frame, and generates an SF density map for each chip. In that case, the logical OR operation unit 83 implements a logical OR operation of map values of the SF density maps with respect to the temporary shot mesh regions 49 (first mesh region) which overlap with each other at the boundary between adjacent frame regions 46. In other words, the logical OR operation is performed for the temporary shot mesh regions 49 which are equivalent to the same position in the chip 44.

Figure 12:
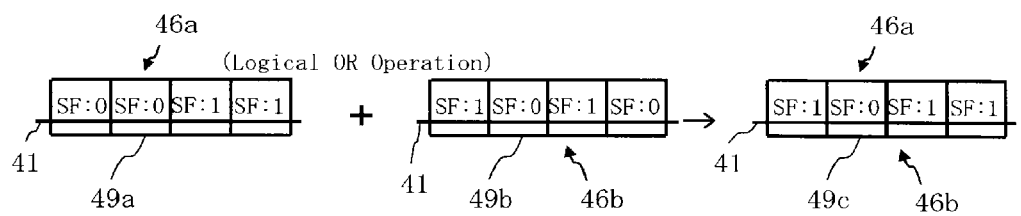
FIG. 12 shows an example of a frame boundary portion of the SF density map according to the second embodiment.

FIG. 12 shows an example of a frame boundary portion of the SF density map according to the second embodiment. The division width (also called a frame width or a frame height) when divided into the frame regions 46 and the size of the SF 30 are not necessarily equal to each other nor integral multiple of each other. Since the size of the temporary shot mesh region 49 is the same as that of the SF 30, the temporary shot mesh regions 49 (49a, 49b) located at the end of each frame region 46 may overlap with each other at a boundary 41 between the adjacent frame regions 46 (46a, 46b) in the same chip 44. According to the example of FIG. 12, in the frame region 46a, 0, 0, 1, and 1 are defined sequentially from the left-hand side temporary shot mesh region 49. In the frame region 46b, 1, 0, 1, and 0 are defined sequentially from the left-hand side temporary shot mesh region 49. When merging is performed per chip, if the numbers of SFs of the shot mesh regions 48 which mutually overlap in each frame region 46 are added to each other as described in FIG. 8, an error will occur. Then, with respect to the temporary shot mesh regions 49 (first mesh region) which overlap with each other, a logical OR operation is implemented for map values of the SF density maps. Consequently, after the merge processing per chip, as shown in FIG. 8, 1, 0, 1, and 1 are defined sequentially from the left-hand side temporary shot mesh region 49. Thereby, it is possible to clearly discriminate, by the two values 0 and 1, the existence or nonexistence of a shot figure in each temporary shot mesh region 49 after the merge processing per chip.

In the SF number counting step (S236), the SF number counting unit 85 (measurement unit) measures (counts) the temporary shot mesh region 49 which has been calculated to be 1 by the logical OR operation, as the temporary shot mesh region 49 in which a shot figure exists.

In the shot density map generation step (S240) per chip, the per-chip shot density map generation unit 78 (per-chip region-with-shot-figure number map generation unit) generates a shot density map (region-with-shot-figure number map) for each chip 44 by merging the shot density map for each frame region 46. In that case, a value counted in the SF number counting step (S236) is used for the temporary shot mesh regions 49 which overlap with each other at the boundary between the adjacent frame regions 46.

By what is described above, even when the shot mesh regions 48 overlap with each other between adjacent frame regions 46, it is possible to prevent that an error occurs in the number of SFs defined in the shot density map.

When a pattern of a single chip is written without performing merging of a plurality of chips, it may proceed to the writing time estimation step (S402). The generated shot density map per chip is output or stored in the storage device. Thereby, the shot density map per chip currently generated may be used in the case of another writing processing. When merging is performed for a plurality of chips, subsequently, the steps described below are carried out.

In the SF density map generation step (logical OR operation step) (S250) per merged chip, the logical OR operation unit 89 performs merging of the SF density map of each chip, and generates an SF density map for each merged chip. In that case, the logical OR operation unit 89 implements a logical OR operation of map values of the SF density map per chip, with respect to the temporary shot mesh regions 49 which overlap with each other because merging of a plurality of chips has been performed. In other words, the logical OR operation is performed for the temporary shot mesh regions 49 which are equivalent to the same position in a plurality of chips 44 for which merging is performed.

Figure 13:
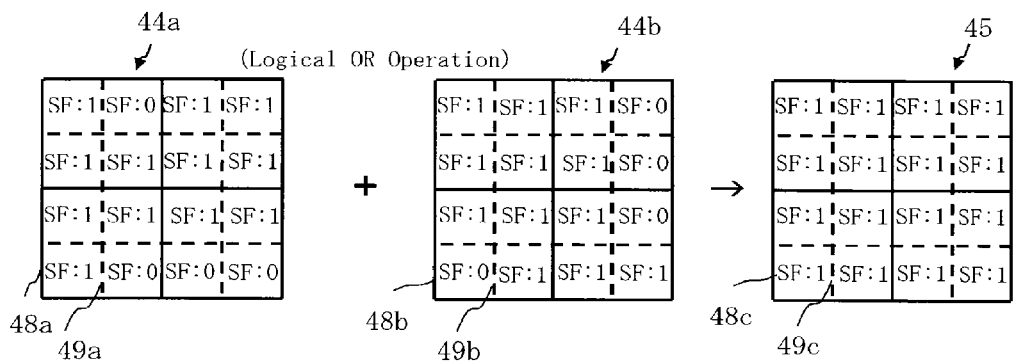
FIG. 13 shows an example of an SF density map per chip according to the second embodiment.
Figure 14:
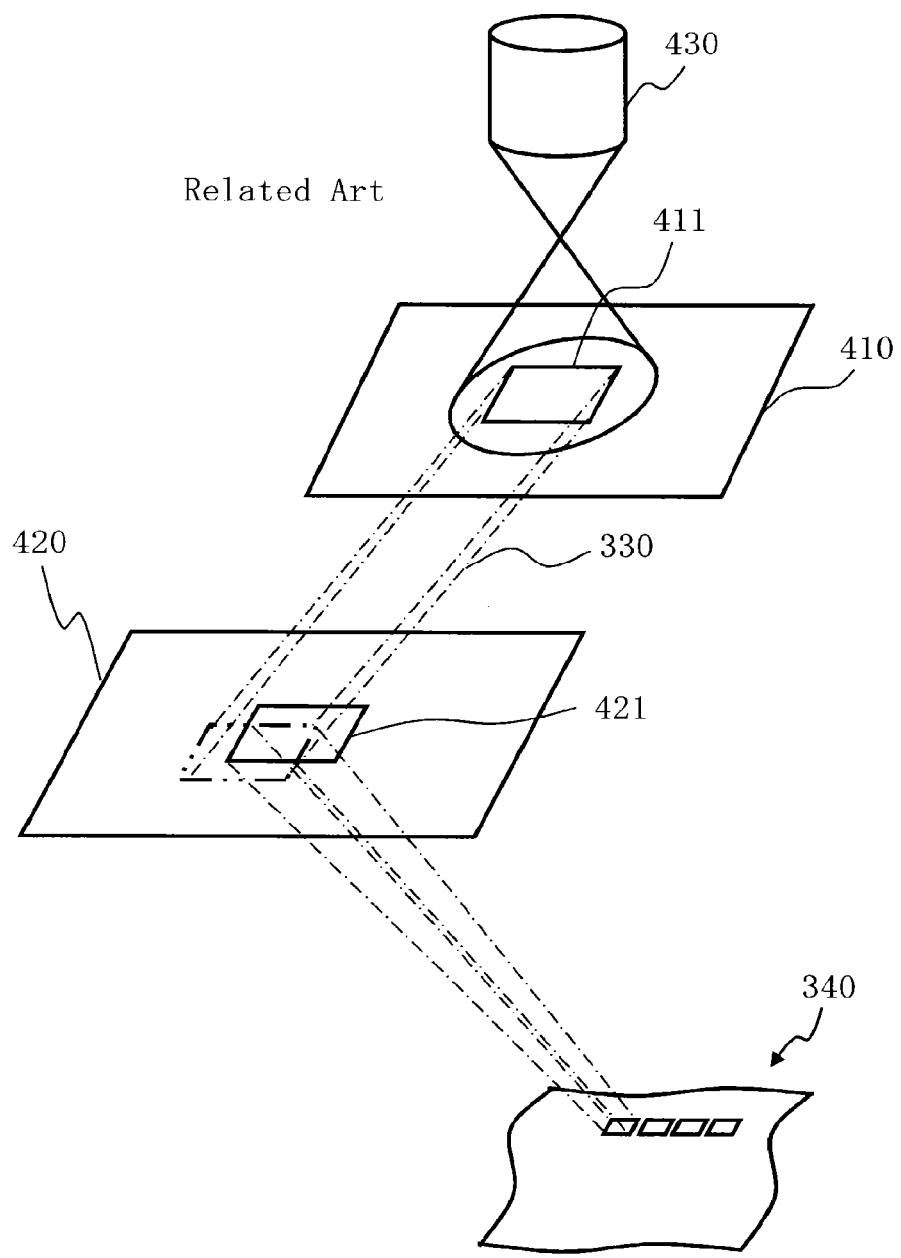
FIG. 14 is a conceptual diagram explaining operations of a variable-shaped electron beam writing apparatus.

FIG. 13 shows an example of the SF density map per chip according to the second embodiment. FIG. 13 shows the case of counting the number of SFs of the merged chip 45 (virtual chip) which is obtained by merging the chip 44a (component chip 1 of the virtual chip) and the chip 44b (component chip 2 of the virtual chip). The region of the chip 44a is virtually divided into a plurality of temporary shot mesh regions 49a. For easy understanding, the shot mesh region 48a composed, for example, of four (2×2) temporary shot mesh regions 49a is also shown for the sake of convenience. Similarly, the region of the chip 44b is virtually divided into a plurality of temporary shot mesh regions 49b. For easy understanding, the shot mesh region 48b composed, for example, of four (2×2) temporary shot mesh regions 49b is also shown for the sake of convenience. Since the temporary shot mesh region 49 and the SF 30 have the same size, it is denoted as "SF" instead of the temporary shot mesh region 49 in FIG. 13 as well as FIG. 8.

When the figure pattern 31 being the same as that of FIG. 8 is arranged at the chips 44a and 44b, each of the SF density map of the chips 44a and 44b is as described below.

With respect to the SF density map of the chip 44a in FIG. 13, in the four (2×2) temporary shot mesh regions 49a by which the lower left shot mesh region 48a is configured, since a shot figure is arranged in the lower left temporary shot mesh region 49a, "1" is defined. Similarly, since a shot figure is arranged in the upper left temporary shot mesh region 49a, "1" is defined. Similarly, since a shot figure is arranged in the upper right temporary shot mesh region 49a, "1" is defined. However, since a shot figure is not arranged in the lower right temporary shot mesh region 49a, "0" is defined.

With respect to the SF density map of the chip 44a, in the four (2×2) temporary shot mesh regions 49a by which the lower right shot mesh region 48a is configured, since a shot figure is not arranged in the lower left temporary shot mesh region 49a, "0" is defined. Similarly, since a shot figure is not arranged in the lower right temporary shot mesh region 49a, "0" is defined. However, since a shot figure is arranged in the upper left temporary shot mesh region 49a, "1" is defined. Similarly, since a shot figure is arranged in the upper right temporary shot mesh region 49a, "1" is defined.

With respect to the SF density map of the chip 44a, in the four (2×2) temporary shot mesh regions 49a by which the upper left shot mesh region 48a is configured, since a shot figure is arranged in the lower left temporary shot mesh region 49a, "1" is defined. Similarly, since a shot figure is arranged in the lower right temporary shot mesh region 49a, "1" is defined. Similarly, since a shot figure is arranged in the upper left temporary shot mesh region 49a, "1" is defined. However, since a shot figure is not arranged in the upper right temporary shot mesh region 49a, "0" is defined.

With respect to the SF density map of the chip 44a, in the four (2×2) temporary shot mesh regions 49a by which the upper right shot mesh region 48a is configured, since a shot figure is arranged in the lower left temporary shot mesh region 49a, "1" is defined. Similarly, since a shot figure is arranged in the lower right temporary shot mesh region 49a, "1" is defined. Similarly, since a shot figure is arranged in the upper left temporary shot mesh region 49a, "1" is defined. Similarly, since a shot figure is arranged in the upper right temporary shot mesh region 49a, "1" is defined.

Also, with respect to the chip 44b, an SF density map can be generated similarly to the chip 44a by performing each of the dividing-into-shots step (S102), the shot number map generation step (S104), the data amount estimation step (S106), and the data amount determination step (S108), and each from the merge number calculation step (S211) to the shot-figure-existence determination step (S216).

With respect to the SF density map of the chip 44b in FIG. 13, in the four (2×2) temporary shot mesh regions 49b by which the lower left shot mesh region 48b is configured, since a shot figure is not arranged in the lower left temporary shot mesh region 49b, "0" is defined. However, since a shot figure is arranged in the lower right temporary shot mesh region 49b, "1" is defined. Similarly, since a shot figure is arranged in the upper left temporary shot mesh region 49b, "1" is defined. Similarly, since a shot figure is arranged in the upper right temporary shot mesh region 49b, "1" is defined.

With respect to the SF density map of the chip 44b, in the four (2×2) temporary shot mesh regions 49b by which the lower right shot mesh region 48b is configured, since a shot figure is arranged in the lower left temporary shot mesh region 49b, "1" is defined. Similarly, since a shot figure is arranged in the lower right temporary shot mesh region 49b, "1" is defined. Similarly, since a shot figure is arranged in the upper left temporary shot mesh region 49b, "1" is defined. However, since a shot figure is not arranged in the upper right temporary shot mesh region 49b, "0" is defined.

With respect to the SF density map of the chip 44b, in the four (2×2) temporary shot mesh regions 49b by which the upper left shot mesh region 48b is configured, since a shot figure is arranged in the lower left temporary shot mesh region 49b, "1" is defined. Similarly, since a shot figure is arranged in the lower right temporary shot mesh region 49b, "1" is defined. Similarly, since a shot figure is arranged in the upper left temporary shot mesh region 49b, "1" is defined. Similarly, since a shot figure is arranged in the upper right temporary shot mesh region 49b, "1" is defined.

With respect to the SF density map of the chip 44b, in the four (2×2) temporary shot mesh regions 49b by which the upper right shot mesh region 48b is configured, since a shot figure is arranged in the lower left temporary shot mesh region 49b, "1" is defined. Similarly, since a shot figure is arranged in the upper left temporary shot mesh region 49b, "1" is defined. However, since a shot figure is not arranged in the lower right temporary shot mesh region 49b, "0" is defined. Similarly, since a shot figure is not arranged in the upper right temporary shot mesh region 49b, "0" is defined.

As shown in FIG. 13, by implementing a logical OR operation for the SF density map of the chip 44a and the SF density map of the chip 44b, with respect to the SF density map of the merged chip 45 after the merge processing, "1" is defined for each of the four (2×2) temporary shot mesh regions 49c by which the lower left shot mesh region 48c is configured.

With respect to the SF density map of the merged chip 45, "1" is defined for each of the four (2×2) temporary shot mesh regions 49c by which the lower right shot mesh region 48c is configured.

With respect to the SF density map of the merged chip 45, "1" is defined for each of the four (2×2) temporary shot mesh regions 49c by which the upper left shot mesh region 48c is configured.

With respect to the SF density map of the merged chip 45, "1" is defined for each of the four (2×2) temporary shot mesh regions 49c by which the upper right shot mesh region 48c is configured.

In the SF number counting step (S254), regarding the temporary shot mesh region 49c which has been calculated to be 1 by the logical OR operation as the temporary shot mesh region 49c in which a shot figure exists, for each shot mesh region 48c (second mesh region), the SF number counting unit 91 (second measurement unit) measures (counts), in the shot mesh region 48c concerned, the number of temporary shot mesh regions 49c each of which has been determined that a shot figure exists therein.

In the shot density map generation step (S256) per merged chip, the per-merged-chip shot density map generation unit 94 (per-merged-chip region-with-shot-figure number map generation unit) generates, with respect to the merged chip 45 obtained by merging the chips 44a and 44b, a shot density map (region-with-shot-figure number map) for each merged chip 45 region, where the number of temporary shot mesh regions 49c measured in the SF number counting step (S254) is used as a map value. In the case of FIG. 13, in the shot density map of the merged chip 45 after the merge processing, the number of SFs in the lower left shot mesh region 48c is four, that in the lower right shot mesh region 48c is four, that in the upper left shot mesh region 48c is four, and that in the upper right shot mesh region 48c is four. Therefore, no error has occurred.

By what is described above, even when merging is performed for a plurality of chips, it is possible to prevent that an error occurs in the number of SFs defined in the shot density map.

Thus, according to the second embodiment, even when some or all of the shot mesh regions 48 overlap with each other because merge processing has been performed, it is possible to prevent that an error occurs in the number of SFs defined in each shot mesh region 48 after having been merged.

Embodiments have been explained referring to specific examples described above. However, the present invention is not limited to these specific examples.

While the apparatus configuration, control method, and the like not directly necessary for explaining the present invention are not described, some or all of them can be selectively used case-by-case basis. For example, although description of the configuration of the control unit for controlling the writing apparatus 100 is omitted, it should be understood that some or all of the configuration of the control unit can be selected and used appropriately when necessary.

In addition, any other charged particle beam writing apparatus and method that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A charged particle beam writing apparatus comprising:
    a storage configured to store writing data which defines data on a chip including a plurality of figure patterns;
    a first mesh region setting processing circuitry configured to set, in a case where a charged particle beam is deflected such that it moves between a plurality of small regions obtained by virtually dividing a writing region of a target object into mesh-like small regions by a predetermined same size by using one deflector of multiple stage deflector, a plurality of first mesh regions obtained by virtually dividing a region of the chip into mesh-like regions by length and width sizes same as those of each of the plurality of small regions;
    a dividing-into-shots processing circuitry configured to divide each of the plurality of figure patterns into a plurality of shot figures by a size that can be irradiated by one shot of the charged particle beam;
    a shot-figure-existence determination processing circuitry configured to assign the plurality of shot figures to the plurality of first mesh regions, and determine whether a shot figure having been assigned exists in each of the plurality of first mesh regions;
    a merge processing circuitry configured to perform, with respect to the plurality of first mesh regions, merging of two or more adjacent first mesh regions;
    a measurement processing circuitry configured to measure, for each second mesh region of a plurality of second mesh regions each obtained by merging two or more first mesh regions, a number of first mesh regions each of which has been determined that the shot figure having been assigned exists therein, in a second mesh region concerned of the plurality of second mesh regions;
    a per-chip region-with-shot-figure number map generation processing circuitry configured to generate a region number map for each the chip, where the number of first mesh regions with the shot figure which has been measured is defined as a map value;
    a deflection time estimation processing circuitry configured to estimate, by using the region number map, a deflection time for deflecting the charged particle beam to move between the plurality of small regions in a case of writing the chip concerned; and
    a writing mechanism including a stage on which the target object is placed, a charged particle beam source, and the multiple stage deflector, configured to write the plurality of figure patterns in the chip concerned on the target object while performing multiple stage deflection of the charged particle beam by the multiple stage deflector.

2. The apparatus according to claim 1 further comprising:
    a merge number calculation unit configured to calculate a merge number being a number of first mesh regions for the merging.

3. The apparatus according to claim 1 further comprising:
    a shot-figure-existence determination map generation processing circuitry configured to generate a shot-figure-existence determination map, where map values are 1 for the first mesh region which has been determined that the shot figure having been assigned exists therein, and 0 (zero) for the first mesh region which has been determined to include no shot figure;
    a per-frame region-with-shot-figure number map generation processing circuitry configured to generate, for each frame region of a plurality of frame regions obtained by virtually dividing the region of the chip into strip-shaped regions, a region number map for the each frame region, where the number of the first mesh regions having been measured is defined as a map value; and
    a logical OR operation processing circuitry configured to implement, with respect to first mesh regions which overlap with each other at a boundary between adjacent frame regions in the plurality of first mesh regions, a logical OR operation for the map values of the shot-figure-existence determination maps, wherein existence or nonexistence of the shot figure is determined based on whether a reference point of the shot figure concerned exists in the first mesh region concerned, and the measurement processing circuitry measures the first mesh region which has been calculated to be 1 by the logical OR operation, as the first mesh region in which a shot figure exists.

4. The apparatus according to claim 1, wherein existence or nonexistence of the shot figure is determined based on whether a reference point of the shot figure concerned exists in the first mesh region concerned, further comprising:

a shot-figure-existence determination map generation processing circuitry configured to generate a shot-figure-existence determination map, where map values are 1 for the first mesh region which has been determined that the shot figure having been assigned exists therein, and 0 (zero) for the first mesh region which has been determined to include no shot figure;

a logical OR operation processing circuitry configured to implement, with respect to the first mesh regions which overlap with each other because merging of a plurality of chips has been performed, a logical OR operation of the map values of the shot-figure-existence determination maps;

a second measurement processing circuitry configured to measure, for the each second mesh region, a number of the first mesh regions each of which has been determined that the shot figure having been assigned exists therein, in the each second mesh region concerned, while regarding the first mesh region which has been calculated to be 1 by the logical OR operation as the first mesh region in which a shot figure exists; and a per-merged-chip region-with-shot-figure number map generation processing circuitry configured to generate, with respect to a merged chip obtained by merging a plurality of chips, a region number map for each the merged chip, where the number of the first mesh regions having been measured is used as a map value.

5. A charged particle beam writing apparatus comprising:

a storage configured to store writing data which defines data on a chip including a plurality of figure patterns;

a first mesh region setting processing circuitry configured to set, in a case where a charged particle beam is deflected such that it moves between a plurality of small regions obtained by virtually dividing a writing region of a target object into mesh-like small regions by a predetermined same size by using one deflector of multiple stage deflector, a plurality of first mesh regions obtained by virtually dividing a region of the chip into mesh-like regions by length and width sizes which is n times length and width sizes of each of the plurality of small regions;

a dividing-into-shots processing circuitry configured to divide each of the plurality of figure patterns into a plurality of shot figures by a size that can be irradiated by one shot of the charged particle beam;

a shot-figure-existence determination processing circuitry configured to assign the plurality of shot figures to the plurality of first mesh regions, and determine whether a shot figure having been assigned exists in each of the plurality of first mesh regions;

a per-chip region-with-shot-figure number map generation processing circuitry configured to generate a region number map for each the chip, where map values are n×n for the first mesh region which has been determined that the shot figure having been assigned exists therein, and 0 (zero) for the first mesh region which has been determined to include no shot figure;

a deflection time estimation processing circuitry configured to estimate, by using the region number map, a deflection time for deflecting the charged particle beam to move between the plurality of small regions in a case of writing the chip concerned; and a writing mechanism including a stage on which the target object is placed, a charged particle beam source, and the multiple stage deflector, configured to write the plurality of figure patterns in the chip concerned on the target object while performing multiple stage deflection of the charged particle beam by the multiple stage deflector.

6. A charged particle beam writing method comprising:

setting, in a case where a charged particle beam is deflected such that it moves between a plurality of small regions obtained by virtually dividing a writing region of a target object into mesh-like small regions by a predetermined same size by using one deflector of multiple stage deflector, a plurality of first mesh regions obtained by virtually dividing a region of a chip including a plurality of figure patterns into mesh-like regions by length and width sizes same as those of each of the plurality of small regions;

dividing each of the plurality of figure patterns into a plurality of shot figures by a size that can be irradiated by one shot of the charged particle beam;

assigning the plurality of shot figures to the plurality of first mesh regions, and determining whether a shot figure having been assigned exists in each of the plurality of first mesh regions;

performing, with respect to the plurality of first mesh regions, merging of two or more adjacent first mesh regions;

measuring, for each second mesh region of a plurality of second mesh regions each obtained by merging two or more first mesh regions, a number of first mesh regions each of which has been determined that the shot figure having been assigned exists therein, in a second mesh region concerned of the plurality of second mesh region;

generating a map for each the chip, where the number of first mesh regions having been measured is defined as a map value;

estimating, by using the map, a deflection time for deflecting the charged particle beam to move between the plurality of small regions in a case of writing the chip concerned; and writing the plurality of figure patterns in the chip concerned on the target object while performing multiple stage deflection of the charged particle beam by the multiple stage deflector.

7. The method according to claim 6 further comprising:

calculating a merge number being a number of first mesh regions for the merging.

8. The method according to claim 6 further comprising:

generating a shot-figure-existence determination map, where map values are 1 for the first mesh region which has been determined that the shot figure having been assigned exists therein, and 0 (zero) for the first mesh region which has been determined to include no shot figure;

generating, for each frame region of a plurality of frame regions obtained by virtually dividing the region of the chip into strip-shaped regions, a region number map for the each frame region, where the number of the first mesh regions having been measured is defined as a map value; and implementing, with respect to first mesh regions which overlap with each other at a boundary between adjacent frame regions in the plurality of first mesh regions, a logical OR operation for the map values of the shot-figure-existence determination maps, wherein existence or nonexistence of the shot figure is determined based on whether a reference point of the shot figure concerned exists in the first mesh region concerned, and the first mesh region which has been calculated to be 1 by the logical OR operation is measured as the first mesh region in which a shot figure exists.

9. The method according to claim 6, wherein existence or nonexistence of the shot figure is determined based on whether a reference point of the shot figure concerned exists in the first mesh region concerned, further comprising:

generating a shot-figure-existence determination map, where map values are 1 for the first mesh region which has been determined that the shot figure having been assigned exists therein, and 0 (zero) for the first mesh region which has been determined to include no shot figure;

implementing, with respect to the first mesh regions which overlap with each other because merging of a plurality of chips has been performed, a logical OR operation of the map values of the shot-figure-existence determination maps;

measuring, for the each second mesh region, a number of the first mesh regions each of which has been determined to include a shot figure, in the each second mesh region concerned, while regarding the first mesh region which has been calculated to be 1 by the logical OR operation as the first mesh region in which a shot figure exists; and generating, with respect to a merged chip obtained by merging a plurality of chips, a region number map for each the merged chip, where the number of the first mesh regions having been measured is used as a map value.

10. A charged particle beam writing method comprising:

setting, in a case where a charged particle beam is deflected such that it moves between a plurality of small regions obtained by virtually dividing a writing region of a target object into mesh-like small regions by a predetermined same size by using one deflector of multiple stage deflector, a plurality of first mesh regions obtained by virtually dividing a region of the chip including a plurality of figure patterns into mesh-like regions by length and width sizes which is n times length and width sizes of each of the plurality of small regions;

dividing each of the plurality of figure patterns into a plurality of shot figures by a size that can be irradiated by one shot of the charged particle beam;

assigning the plurality of shot figures to the plurality of first mesh regions, and determining whether a shot figure having been assigned exists in each of the plurality of first mesh regions;

generating a map for each the chip, where map values are n×n for the first mesh region which has been determined that the shot figure having been assigned exists therein, and 0 (zero) for the first mesh region which has been determined to include no shot figure;

estimating, by using the map, a deflection time for deflecting the charged particle beam to move between the plurality of small regions in a case of writing the chip concerned; and writing the plurality of figure patterns in the chip concerned on the target object while performing multiple stage deflection of the charged particle beam by the multiple stage deflector.

* * * * *